United States Patent
Kamijima

(10) Patent No.: US 8,021,829 B2
(45) Date of Patent: Sep. 20, 2011

(54) METHOD OF FORMING PHOTORESIST PATTERN AND METHOD OF MANUFACTURING PERPENDICULAR MAGNETIC RECORDING HEAD

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 1077 days.

(21) Appl. No.: 11/713,016

(22) Filed: Mar. 2, 2007

(65) Prior Publication Data

US 2007/0155188 A1  Jul. 5, 2007

(30) Foreign Application Priority Data

Apr. 6, 2006  (JP) ................... 2006-105343

(51) Int. Cl.
*G03C 1/00* (2006.01)
*G03F 7/26* (2006.01)
(52) U.S. Cl. ........................ 430/320; 430/330
(58) Field of Classification Search .................. None
See application file for complete search history.

(56) References Cited

U.S. PATENT DOCUMENTS

| 5,707,765 | A | 1/1998 | Chen |
| 6,670,081 | B2 * | 12/2003 | Laidig et al. ........ 430/5 |
| 6,687,084 | B2 | 2/2004 | Takahashi et al. |
| 6,952,867 | B2 | 10/2005 | Sato |
| 7,008,736 | B2 | 3/2006 | Okamoto |
| 2002/0080525 | A1 * | 6/2002 | Sato et al. ............ 360/126 |

FOREIGN PATENT DOCUMENTS

| JP | B2 2710967 | 10/1997 |
| JP | A 2000-511303 | 8/2000 |
| JP | A-2001-194769 | 7/2001 |
| JP | A 2002-006472 | 1/2002 |
| JP | A 2002-197611 | 7/2002 |
| JP | A-2002-197613 | 7/2002 |
| JP | A 2002-197613 | 7/2002 |
| JP | A 2002-197615 | 7/2002 |
| JP | A-2002-217087 | 8/2002 |
| JP | A-2004-054052 | 2/2004 |

(Continued)

OTHER PUBLICATIONS

Z. Cui, Computer Simulation from Electron Beam Lithography to Optical Lithography(2000).*

(Continued)

*Primary Examiner* — Kathleen Duda
*Assistant Examiner* — Anna L Verderame
(74) *Attorney, Agent, or Firm* — Oliff & Berridge, PLC

(57) ABSTRACT

Provided is a method of forming a photoresist pattern enabling the three dimensional shape of a photoresist pattern to be controlled sufficiently. A photoresist pattern for forming a main magnetic pole layer can be formed by forming a preparatory photoresist pattern having a projected part at a position corresponding to a flare point by selectively exposing and developing a photoresist film, and then heating the preparatory photoresist pattern. In the heating process, the presence of the projected part in the preparatory photoresist pattern relaxes the influence of thermal contraction, and hence the photoresist film is hard to be rounded at the position. Moreover, in the heating process, the preparatory photoresist pattern can be thermally flown and thermally contracted, so that the internal wall in the opening part can be inclined and the projected part can be retreated. Thus, the three dimensional shape of the photoresist pattern approaches a desired three dimensional shape.

3 Claims, 20 Drawing Sheets

FOREIGN PATENT DOCUMENTS

| | | |
|---|---|---|
| JP | A-2004-294732 | 10/2004 |
| JP | A-2005-055537 | 3/2005 |
| JP | A-2005-242004 | 9/2005 |
| JP | A-2006-039258 | 2/2006 |
| WO | WO 97/45772 | 12/1997 |

OTHER PUBLICATIONS

Z. Cui, Microelectronic Engineering 53 (2000) 153-156.*
Date information for Z. Cui, Computer Simulation from Electron Beam Lithography to Optical Lithography(2000).*

* cited by examiner

METHOD OF FORMING PHOTORESIST PATTERN AND METHOD OF MANUFACTURING PERPENDICULAR MAGNETIC RECORDING HEAD

BACKGROUND OF THE INVENTION

1. Field of the Invention

The present invention relates to a method of forming a photoresist pattern using exposure and development processes, and a method of manufacturing a perpendicular magnetic recording head.

2. Description of the Related Art

Recently, photoresist patterns are widely used in the field of manufacturing various devices in order to form a variety of pattern films, such as conductive films or magnetic films, so as to have a desired pattern shape, or apply different selective processes, such as etching or doping, to a processed object within a desired range. In general, the photoresist patterns are attainable by forming a photoresist film, and then exposing and developing the photoresist film with photolithography method.

Many techniques have already been proposed in respect to the method of forming the photoresist patterns. Specifically, in the field of manufacturing a perpendicular magnetic recording head, there is known a method in which, in order to form a magnetic pole layer so as to have a reverse trapezoidal cross section, an opening is formed in a photoresist film with the photolithography method, and the photoresist film is then thermally deformed to gradually widen the opening (for example, refer to Japanese Unexamined Patent Publications Nos. 2002-197611, 2002-197613, and 2002-197615). In the field of manufacturing semiconductor devices, there is known a method using a mask provided with a projected part (a serif), and a mask having a phase shift region and a non-phase shift region in order to set the pattern shape of a circuit pattern as per design (for example, refer to Japanese Unexamined Patent Publication No. 2000-511303 and Japanese Patent No. 2710967).

SUMMARY OF THE INVENTION

However, in consideration of the recent technical trend that the device size tends to be increasingly miniaturized, and therefore the accuracy required in the three dimensional shape of a photoresist pattern is still enhanced, it is hard to say that the above-mentioned method of forming a photoresist pattern of the related art is still sufficient in terms of its forming accuracy. Especially, in the field of manufacturing a perpendicular magnetic recording head where the pattern shape of a magnetic pole layer (particularly the width of the magnetic pole layer at a flare point) has an effect on recording performance, it is necessary to control sufficiently the three dimensional shape of the photoresist pattern in order to form the magnetic pole layer with high accuracy.

In view of the foregoing problem, it is desirable to provide a method of forming a photoresist pattern enabling the three dimensional shape of a photoresist pattern to be controlled sufficiently, and a method of manufacturing a perpendicular magnetic recording head enabling a magnetic pole layer to be formed with high accuracy.

According to an embodiment of the present invention, there is provided a first method of forming a photoresist pattern having a convex-shaped corner part. The method includes: a first step of forming a photoresist film; a second step of selectively exposing and developing the photoresist film so that a projected part can be formed at a position corresponding to the corner part; and a third step of heating the photoresist film until the projected part vanishes.

There is also provided a second method of forming a photoresist pattern having a concave-shaped corner part. The method includes: a first step of forming a photoresist film; a second step of selectively exposing and developing the photoresist film so that a notch part can be formed at a position corresponding to the corner part; and a third step of heating the photoresist film until the notch part vanishes.

With the first and second methods of forming a photoresist pattern, by the presence of the projected part or the notch part in the photoresist film, the influence of thermal contraction can be relaxed in the heating process, and hence the photoresist film is hard to be rounded at the a location where the projected part or the notch part is formed. Moreover, in the heating process, the photoresist film will thermally flow and thermally contract, so that the wall surface can be inclined and the projected part or the notch part can vanish. Thus, the three dimensional shape of the photoresist film after heating can approach a desired three dimensional shape. The term "convex-shaped corner part" means a corner part having an angle in a range of above 0 degree to below 180 degrees. The term "concave-shaped corner part" means a corner part having an angle in a range of above 180 degrees to below 360 degrees.

According to another embodiment of the present invention, there is provided a method of manufacturing a perpendicular magnetic recording head provided with a magnetic pole layer, the magnetic pole layer expanding from a uniform width defining a recording track width to a width larger than the uniform width. The method includes: a first step of forming a photoresist film; a second step of selectively exposing and developing the photoresist film so that a projected part can be formed at a position corresponding to a position where the magnetic pole layer starts to increase in width from the uniform width; a third step of heating the photoresist film until the projected part vanishes; and a fourth step of forming the magnetic pole layer in a region other than the photoresist film with no projected part.

With the method of manufacturing a perpendicular magnetic recording head, the three dimensional shape of the photoresist film after heating can approach a desired three dimensional shape.

In accordance with the method of forming a photoresist pattern of the present invention, the three dimensional shape of the photoresist pattern can be controlled sufficiently because the photoresist film is formed and then selectively exposed and developed so that the projected part or the notch part can be formed at the position corresponding to the convex-shaped or the concave-shaped corner part of the photoresist pattern, and thereafter, the photoresist film is heated so that the projected part or the notch part vanishes. In accordance with the method of manufacturing a perpendicular magnetic recording head to which the method of forming a photoresist pattern is applied, the magnetic pole layer can be formed with high accuracy.

Other and further objects, features and advantages of the invention will appear more fully from the following description.

DESCRIPTION OF THE PREFERRED EMBODIMENTS

Preferred embodiments of the present invention will now be described in detail with reference to the accompanying drawings.

First Preferred Embodiments

Figures 1A, 1B:
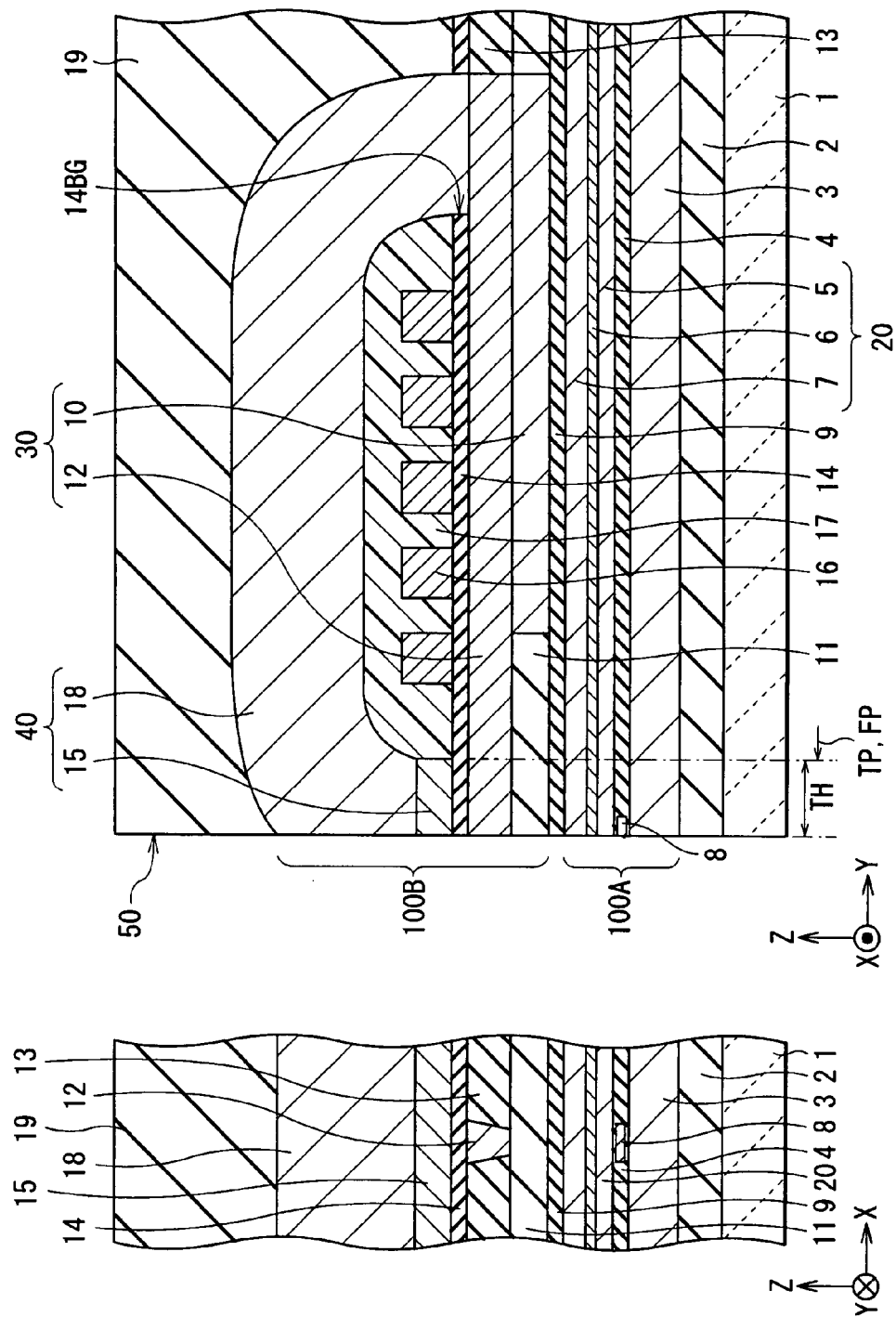
FIGS. 1A and 1B are sectional views each showing the sectional configuration of a thin film magnetic head manufactured by using a method of manufacturing a thin film magnetic head, to which a method of forming a photoresist pattern according to a first preferred embodiment of the present invention is applied.
Figure 2:
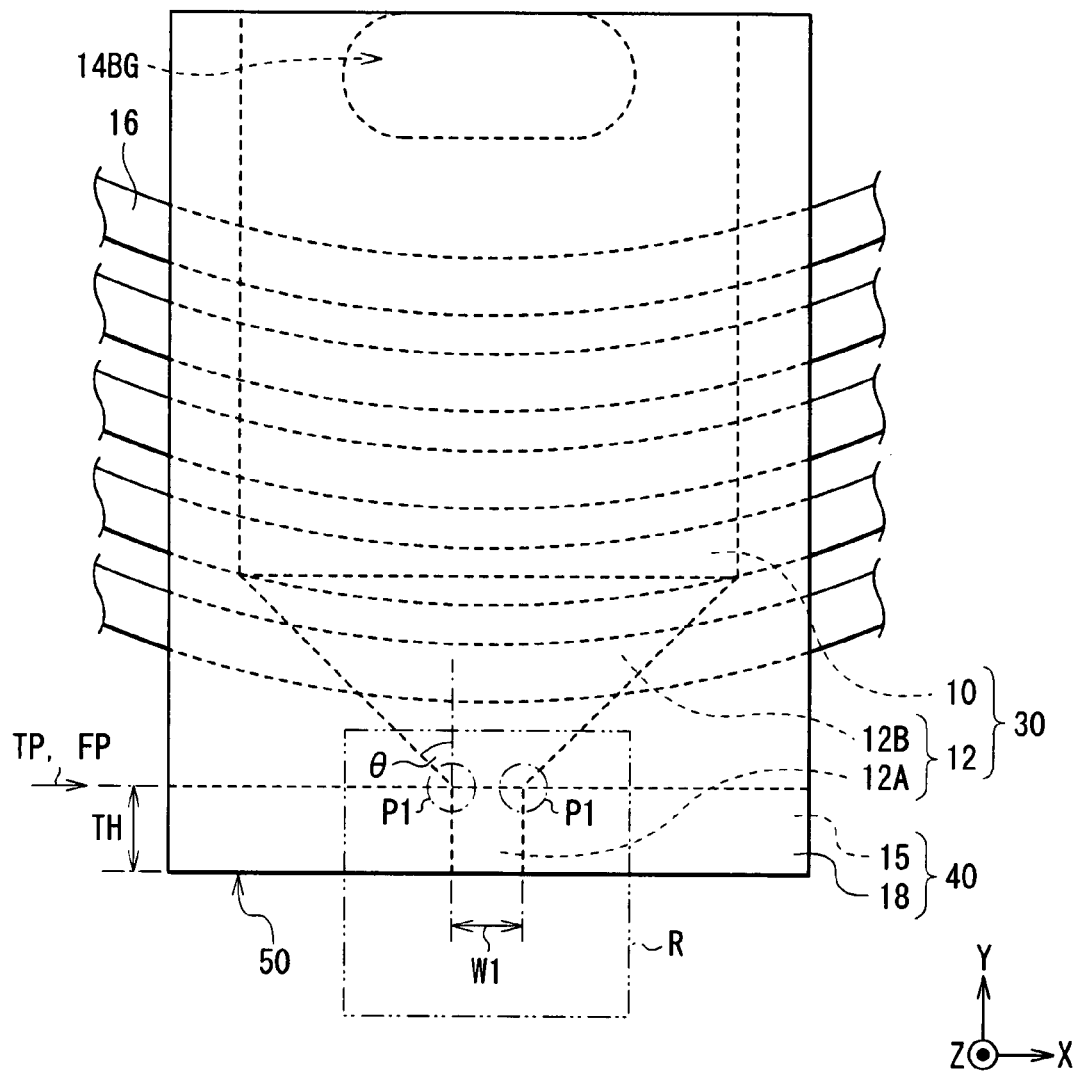
FIG. 2 is a plan view showing the plan configuration of the thin film magnetic head shown in FIGS. 1A and 1B.
Figure 3:
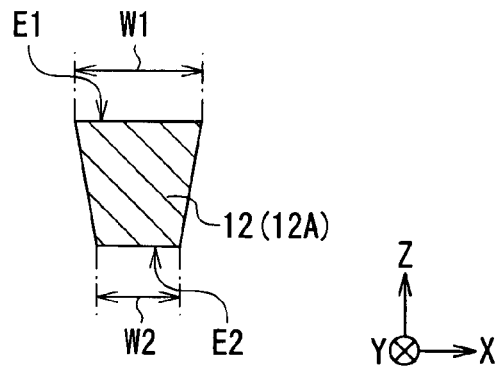
FIG. 3 is a sectional view showing in enlarged dimension the sectional configuration of a main magnetic pole layer shown in FIG. 1A.
Figure 8A:
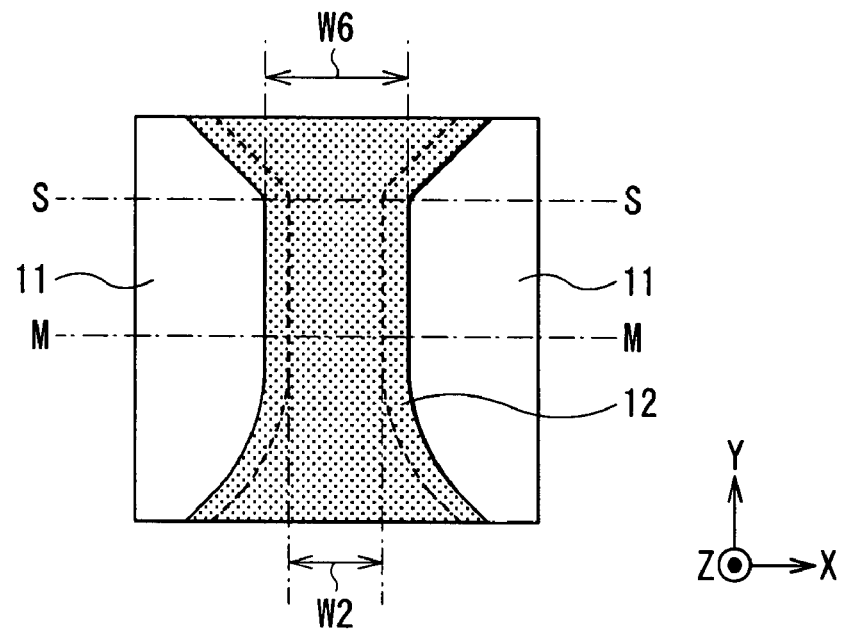
FIGS. 8A and 8B are a plan view and a sectional view for explaining a step followed by the step shown in FIGS. 7A and 7B, respectively.
Figure 8B:
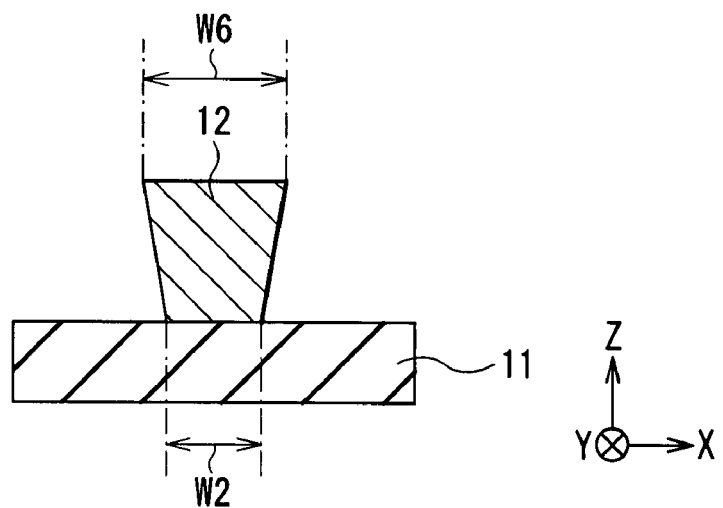
Figure 9A:
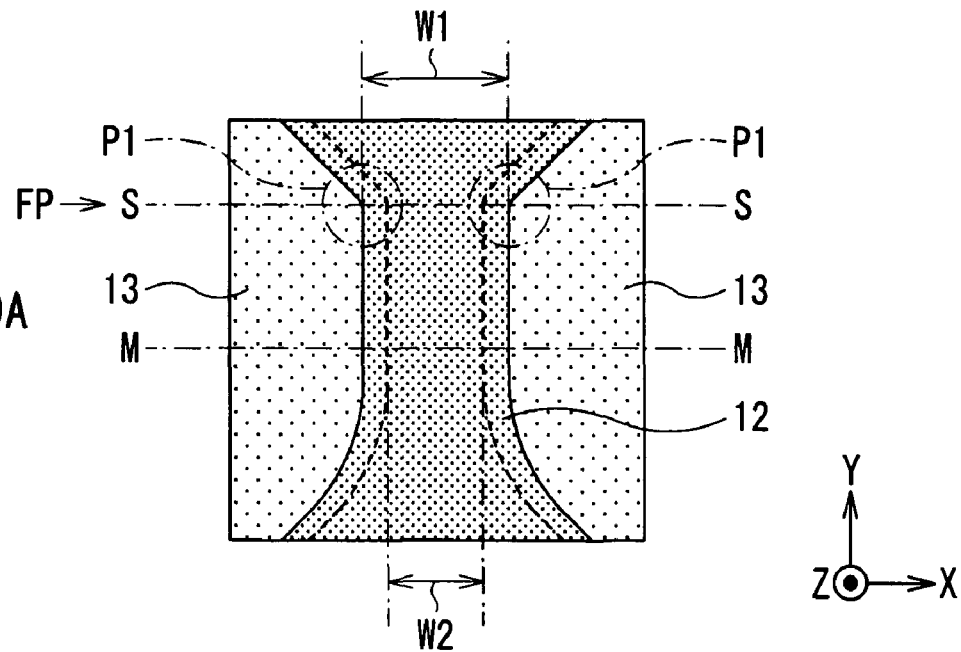
FIGS. 9A and 9B are a plan view and a sectional view for explaining a step followed by the step shown in FIGS. 8A and 8B, respectively.
Figure 9B:
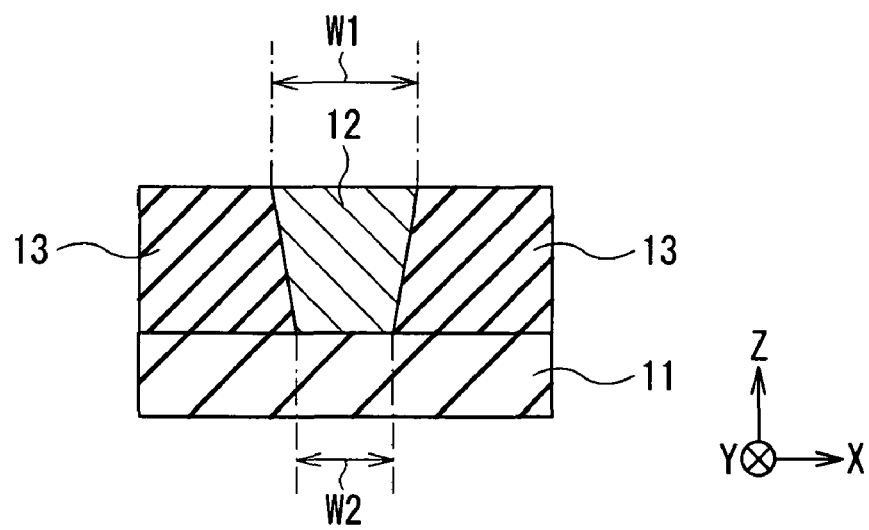
Figure 10:
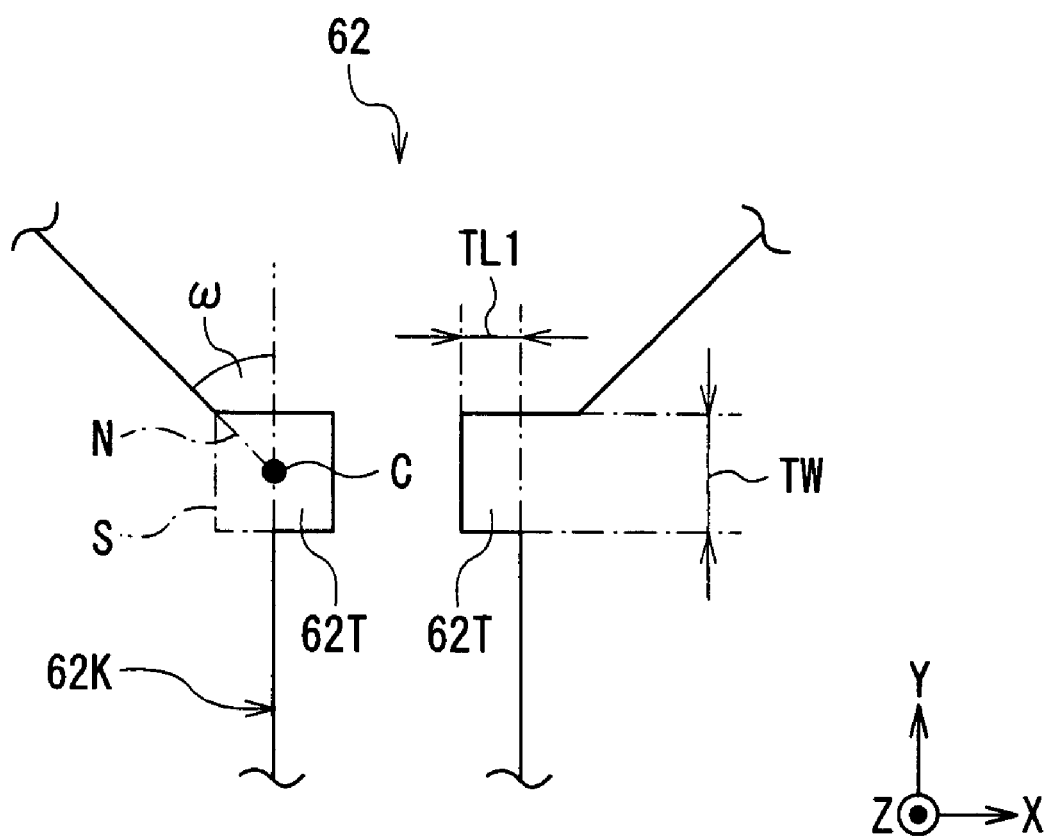
FIG. 10 is a plan view showing in enlarged dimension the contour of a mask shown in FIG. 4A.

FIG. 1A to FIG. 10 are for purposes of explaining a method of manufacturing a thin film magnetic head equipped with a perpendicular magnetic recording head, as an application of a method of forming a photoresist pattern according to a first preferred embodiment. FIGS. 1A and 1B, and FIG. 2 show the sectional configurations and the plan configuration of the thin film magnetic head, respectively. FIGS. 1A and 1B show the sectional views parallel to and vertical to an air bearing surface 50, respectively. FIG. 3 shows in enlarged dimension the sectional configuration of a main magnetic pole layer 12 shown in FIG. 1A. FIGS. 4A to 9B are for purposes of explaining a method of manufacturing a thin film magnetic head. FIGS. 4A, 5A, 6A, 7A, 8A, and 9A, and FIGS. 4B, 5B, 6B, 7B, 8B, and 9B show in enlarged dimension the plan configurations and the sectional configurations of a region R taken from FIG. 2, respectively. Specifically, FIGS. 4B, 5B, 6B, 7B, 8B, and 9B show the cross sections taken along the line M-M in FIGS. 4A, 5A, 6A, 7A, 8A, and 9A, respectively. FIG. 10 shows in enlarged dimension the contour of a mask 62 shown in FIG. 4A.

After the overall configuration of the thin film magnetic head will be briefly described with reference to FIGS. 1A to 3, the method of manufacturing a thin film magnetic head will be described with reference to FIGS. 1A to 10.

This thin film magnetic head is, for example, a composite head capable of performing both of recording process and reproducing process, and constructed of the followings in the order named: a substrate 1 made of aluminium oxide titanium carbonate ($Al_2O_3.TiC$), an insulating layer 2, a reproducing head part 100A, an isolating layer 9, a recording head part 100B, and an overcoat layer 19, which are stacked so as to construct an air bearing surface 50 at an end.

The reproducing head part 100A performs reproducing process by utilizing GMR (giant magneto-photoresistive) effect or TMR (tunneling magneto-photoresistive) effect, and includes the followings stacked in the order named: a lower lead shield layer 3, a shield gap film 4 with an MR element 8 buried so as to expose to the air bearing surface 50, and an upper lead shield layer 20. The upper lead shield layer 20 has, for example, a three-layer structure in which two magnetic layers 5 and 7 are stacked with a non-magnetic layer 6 interposed therebetween.

The recording head part 100B is a perpendicular magnetic recording head to perform the recording process of a perpendicular recording system, and it is constructed of the followings stacked in the order named: a magnetic pole layer 30 whose periphery is buried with insulating layers 11 and 13, a gap layer 14 provided with an opening for magnetic joining (a back gap 14BG), a spiral type thin film coil 16 buried with an insulating layer 17, and a magnetic layer 40 (a so-called shield type head). The magnetic pole layer 30 is, for example, constructed of the followings stacked in the order named: an auxiliary magnetic pole layer 10 retreated from the air bearing surface 50, and a main magnetic pole layer 12 exposed on the air bearing surface 50. The main magnetic pole layer 12 has, as shown in FIG. 2, a pattern shape which includes in sequence from the air bearing surface 50, a tip portion 12A having a uniform width W1 defining a recording track width, and a rear end portion 12B having a width larger than the uniform width. Here, for example, the width of the rear end portion 12B is increased gradually, and thereafter maintained uniformly. Its expansion angle θ (an angle between the direction of extension of the tip portion 12A and the outer edge of the rear end portion 12B) is within a range of above 0 degree to below 90 degrees. The position where the main magnetic pole layer 12 starts to increase in width from the uniform width W1 is a so-called flare point FP. The flare point FP is the position where, when a magnetic flux flows from the rear end portion 12B to the tip portion 12A in the inside of the main magnetic pole layer 12, the magnetic flux is throttled in order to supply a sufficient amount of magnetic flux to the tip portion 12A. That is, the flare point FP is one of important factors contributing to recording performance. As shown in FIG. 3A, the tip portion 12A has a cross section of a reverse trapezoid, whose longer side and shorter side are an upper edge E1 (a width W1) locating on the upper side (a trailing side) and a lower edge E2 (a width W2) locating on the lower side (a reading side), respectively. The same is true for the exposed surface exposed on the air bearing surface 50. The magnetic layer 40 is constructed of the followings stacked in the order named: a light shield layer 15 opposed to a magnetic pole layer 30 (the tip portion 12A) with a gap layer 14 interposed therebetween, and a return yoke layer 18 connected to the light shield layer 15 and the magnetic pole layer 30, on a near side and a far side from the air bearing surface 50, respectively. In the insulating layer 17, the position of an edge being the closest to the air bearing surface 50 is a throat height zero position TP, and the distance between the throat height zero position TP and the air bearing surface 50 is a throat height TH. In FIGS. 1A, 1B, and FIG. 2, there are shown the case where the throat height zero position TP agrees with the flare point FP. FIG. 2 shows only the main components of the recording head part 100B.

This thin film magnetic head can be manufactured by stacking in sequence a series of components, from the insulating layer 2 to the overcoat layer 19, on the substrate 1 by using an existing thin film process, and then forming the air bearing surface 50 by using, for example, machining process or polishing process. Examples of the "existing thin film process" are film forming technique represented by plating method or sputtering method; patterning technique represented by photolithography method; etching technique represented by dry etching method or wet etching method, and polishing technique represented by chemical mechanical polishing (CMP).

Figure 4A:
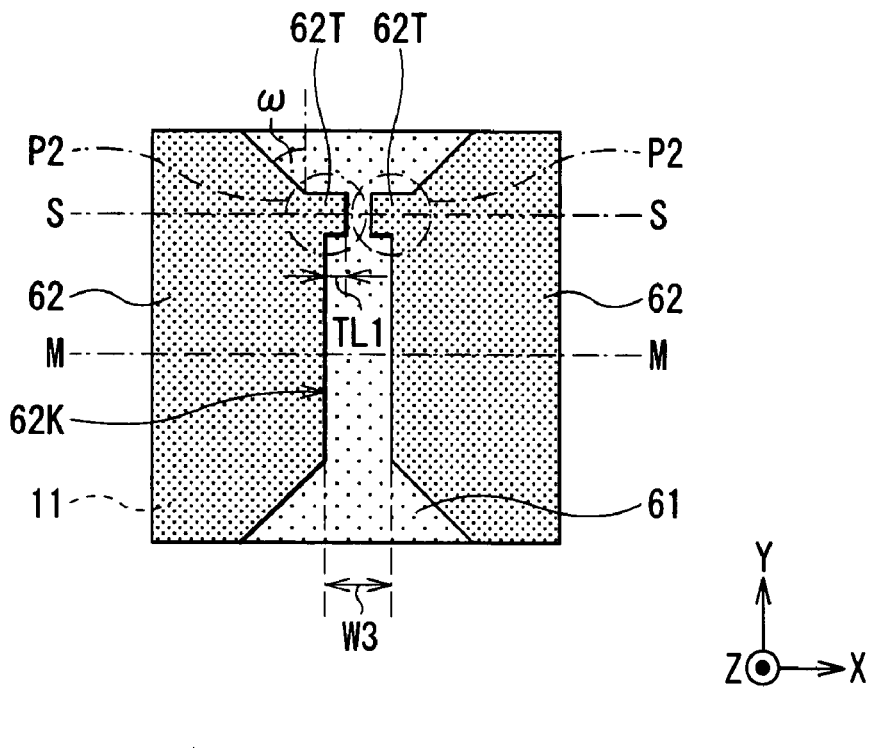
FIGS. 4A and 4B are a plan view and a sectional view showing a step in the method of manufacturing a thin film magnetic head, respectively.
Figure 4B:
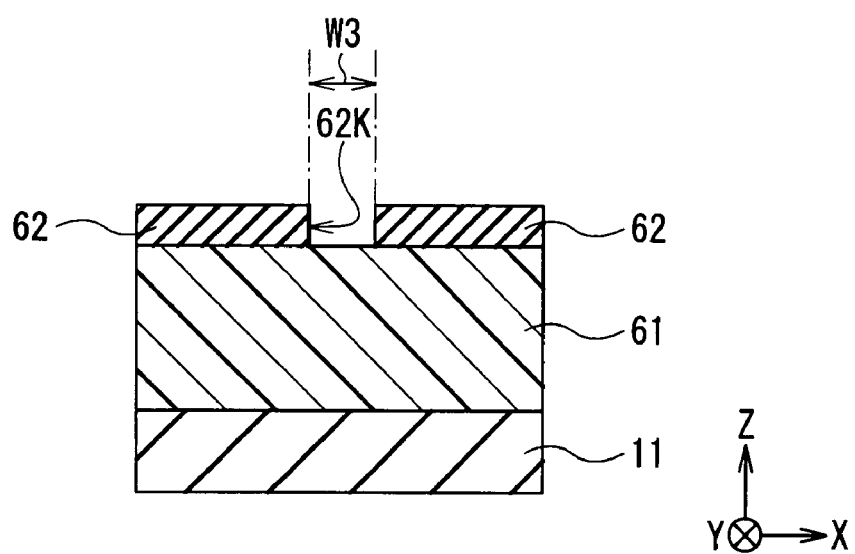

When the main magnetic pole layer 12 is formed by applying the method of forming a photoresist pattern according to the present embodiment, as shown in FIGS. 4A and 4B, firstly, a photoresist film 61 is formed by applying a positive type photoresist onto the surfaces of an auxiliary magnetic layer 10 and the insulating layer 11 (the auxiliary magnetic pole layer 10 is not shown in FIGS. 4A and 4B) by using spin coat method, for example, and then disposing a mask 62 for exposure on the photoresist film 61.

The mask 62 is an open type mask having an opening part 62K which reflects the pattern shape of the main magnetic pole layer 12, and has a projected part 62T at a position P2 corresponding to a convex-shaped corner part 64C (a position P4, refer to FIGS. 6A and 6B) in a photoresist pattern 64 to be formed in the post-process. In order to partially narrow down the opening part 62K, a pair of the projected parts 62T are disposed so as to oppose to each other with the opening part 62K interposed therebetween. The opening part 62K has an opening shape so that, when a photoresist pattern 64 (FIGS. 6A and 6B) can be formed by exposing and developing, and then heating the photoresist film 61 in the post-process, the opening shape of an opening part 64K of the photoresist pattern 64 matches with the pattern shape of the main magnetic pole layer 12 (FIG. 2). Preferably, a width W3 (FIGS. 4A and 4B) of the smallest width region of the opening part 62K (except for the region provided with the projected part 62T) is smaller than a width W1 (FIG. 3) of the tip portion 12A of the main magnetic pole layer 12. The opening expansion angle ω of the mask 62 corresponding to the expansion angle θ (FIG. 2) of the main magnetic pole layer 12 is substantially equal to the expansion angle θ. The term "open type" means a mask structure of a frame pattern type having an opening part, and it is the concept opposed to "isolation type." The term "isolation type" means a mask structure of an isolated pattern type having no opening part.

Each of the projected parts 62T has, for example, a projection length TL1 and a projection width TW, as shown in FIG. 10, and it is larger than a projected part 63T (FIGS. 5A and 5B) of a preparatory photoresist pattern 63 to be formed in the post-process. The expression "the projected part 62T (FIGS. 4A and 4B) is larger than the projected part 63T (FIGS. 5A and 5B)" means that the projected part 62T is larger than the projected part 63T in terms of the projection length TL1 and the projection width TW (FIG. 10). For example, when a salient point C of a mask not having the projected part 62T (a reference mask N) is used as a reference, and a projected part pattern S of a square type is overlapped so that its center can be positioned at the salient point S with respect to the reference mask N, the contour of the mask 62 having the projected part 62T is defined so as to be equal to the contours of the projected shapes of the reference mask N and the projected part pattern S. In this case, the relationship of TW=2×TL1 can be established between the projection length TL1 and the projection width TW. The projection length TL1 and the projection width TW can be set arbitrarily in a range where the preparatory photoresist pattern 63 and the photoresist pattern 64 can be formed in the post-process. As a specific example, the projection length TL1 is preferably about 50 nm or more.

The line M-M shown in FIG. 4A corresponds to the position where the air bearing surface 50 is formed in the post-process. The line S-S indicates the position corresponding to the flare point FP. These are true for FIGS. 4A, 5A, 6A, 7A, 8A, and 9A.

Figure 5A:
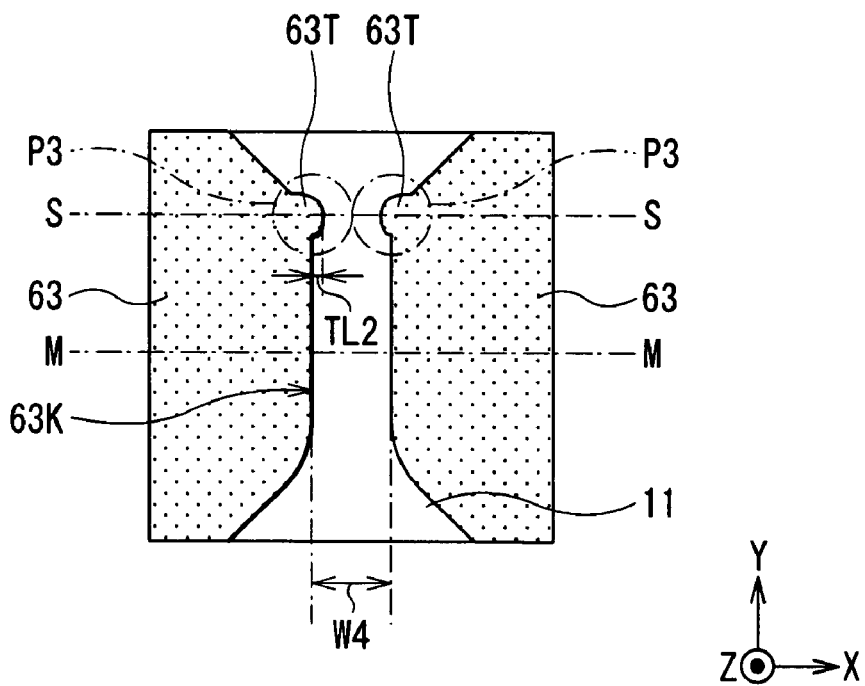
FIGS. 5A and 5B are a plan view and a sectional view for explaining a step followed by the step shown in FIGS. 4A and 4B, respectively.
Figure 5B:
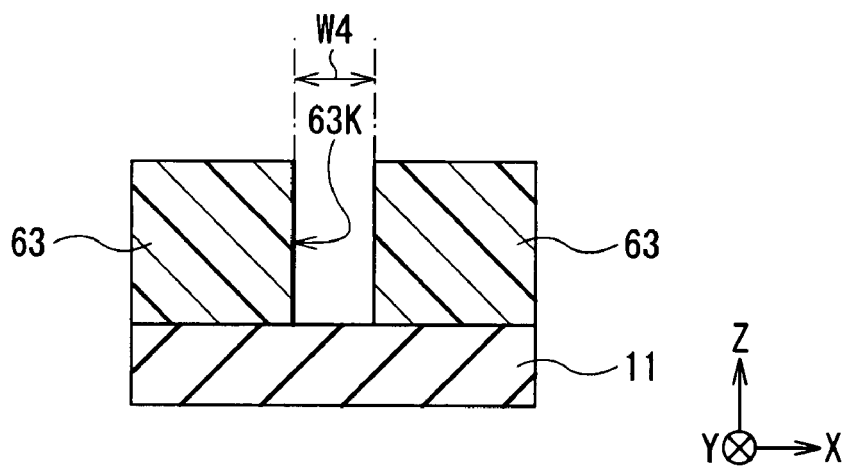
Figure 6A:
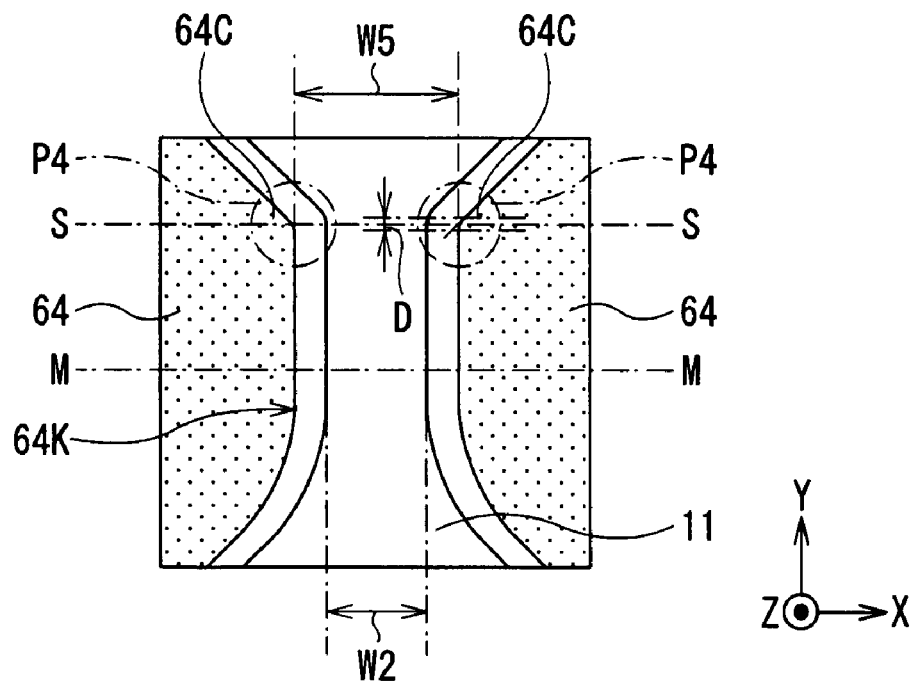
FIGS. 6A and 6B are a plan view and a sectional view for explaining a step followed by the step shown in FIGS. 5A and 5B, respectively.
Figure 6B:
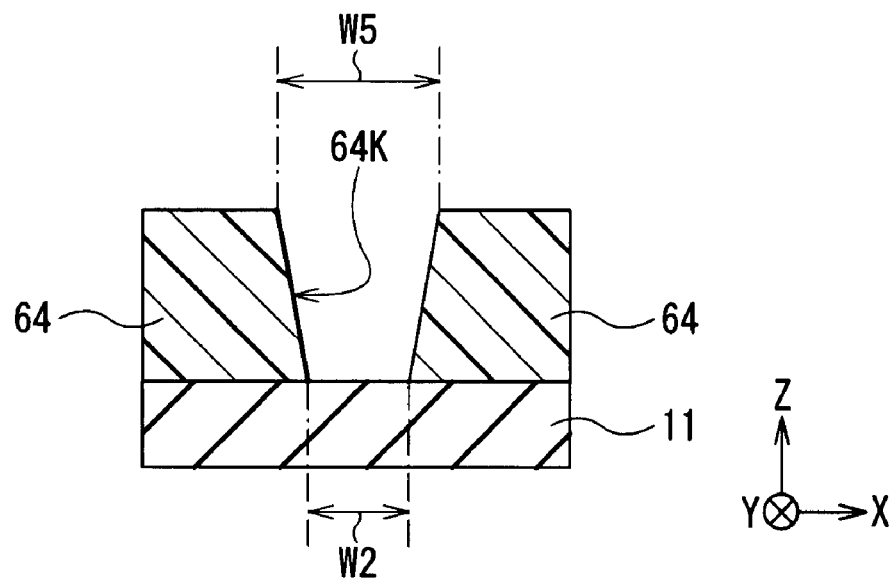

After disposing the mask 62 on the photoresist film 61 (FIGS. 4A and 4B), the photoresist film 61 is selectively exposed and developed by using photolithography method. That is, as shown in FIGS. 5A and 5B, the preparatory photoresist pattern 63 having an opening part 63K (a width W4 in the smallest width region) by irradiating light L for exposure to the photoresist film 61 through the mask 62, and then removing the exposed portion by using a developing solution. The preparatory photoresist pattern 63 is a preparatory pattern for forming the photoresist pattern 64 (FIGS. 6A and 6B). In this case, a projected part 63T having a projection length TL2 is disposed at a position P3 corresponding to the projected part 62T of the mask 62 (the position P2 in FIG. 4A). In the photolithography process, the dimensional relationship between the widths W3 and W4, and the dimensional relationship between the projection lengths TL1 and TL2 before and after exposure can be adjusted arbitrarily according to the photoresist print conditions such as the amount of exposure. The type of an exposure system (exposure conditions) and the type of a developing solution, which are used in the photolithography process, can be set arbitrarily.

Although the present embodiment employs, as shown in FIGS. 4A and 4B, contact exposure method in which the mask 62 is disposed on the photoresist film 61, and the pattern shape of the mask 62 is transferred to the photoresist film 61 by using parallel exposure light, it is not necessarily limited to this. For example, one could employ proximity exposure method in which the transfer is performed with the mask 62 disposed away from the photoresist film 61. In this case, of course, one could use an equivalent or reduction exposure system such as a so-called mirror projection, a stepper, or a scanner, each having an optical system between the photoresist film 61 and the mask 62.

Subsequently, the preparatory photoresist pattern 63 (FIGS. 5A and 5B) is heated to form the photoresist pattern 64 having the opening part 64K as shown in FIGS. 6A and 6B. In this heating process, the preparatory photoresist pattern 63 is subjected to the influence of surface tension thereby to cause thermal flow and thermal contraction, so that the inner wall can be inclined at the opening part 63K and the projected part 63T can be retreated and then vanish (FIGS. 5A and 5B). Thus, as shown in FIGS. 6A and 6B, the opening part 64K becomes wider gradually with increasing the distance between the opening part 64K and the insulating layer 11. That is, the lower end width of the opening part 64K becomes the width W2 larger than the width W4, and the upper end width thereof becomes the width W5 larger than the lower end width W2, as described above. By heating the preparatory photoresist pattern 63 until the projected part 63T vanishes, the projected part 63T does not remain at the position P4 (FIGS. 6A and 6B) corresponding to the position P3 (FIGS. 5A and 5B), and hence the corner part 64C at the position P4 (FIGS. 6A and 6B) becomes nearly sharp. The above-mentioned series of positions P2 to P4 are the positions corresponding to the flare point FP of the main magnetic pole layer 12 (the position P1 in FIG. 2). The conditions such as the heating temperature and the heating time of the preparatory photoresist pattern 63 (FIGS. 5A and 5B) can be set arbitrarily according to the characteristics such as thermal flow property and thermal contraction property.

The above expression "the corner part 64C (FIGS. 6A and 6B) becomes nearly sharp" means that though the corner part 64C is rounded, the tendency to be rounded can be relaxed remarkably. More specifically, it means that, when a rounding range D (nm) is defined to evaluate the dimension of the range of the rounded portion in consideration of the unavoidable rounding of the corner part 64C, the rounding range D becomes sufficiently small (for example, 50 nm or less). The term "rounding range D" is, when considered the extended surfaces of two inner walls defining the corner part 64C (virtual surfaces extending from the surfaces of flat parts in the inner walls), a dimension in the Y-axis direction in a range where the extending surfaces are apart from the surfaces of the actual inner walls, and also an index indicating the sharpness (the degree of not being rounded) of the corner part 64C. When forming the photoresist pattern 64 (FIGS. 6A and 6B), it is preferable to determine in advance the condition under which the angle of inclination of the inner wall has a desired angle and the projected part 63T vanishes, by checking the correlation among the heating time, the angle of inclination of the inner wall, and the amount of retreating.

Figure 7A:
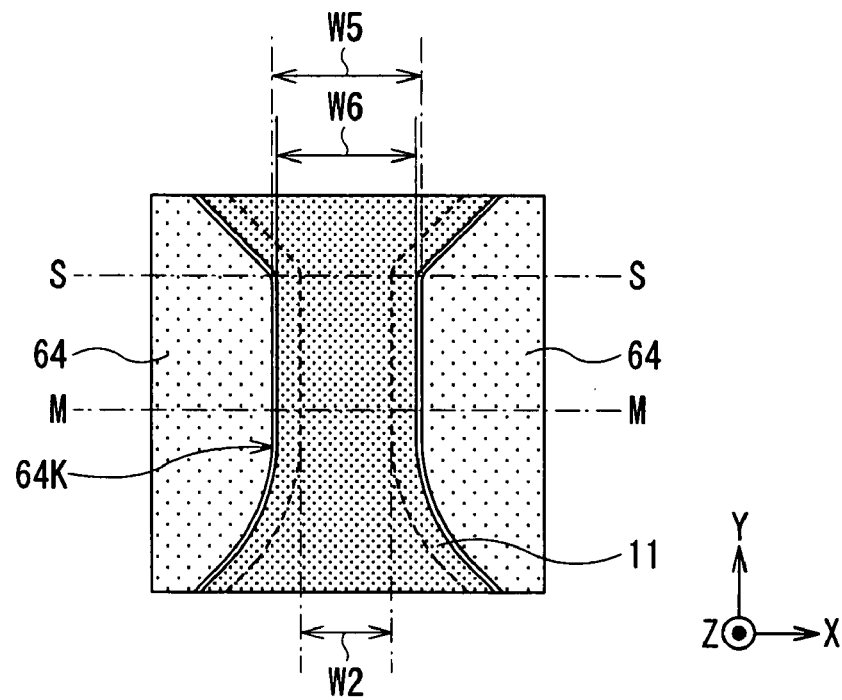
FIGS. 7A and 7B are a plan view and a sectional view for explaining a step followed by the step shown in FIGS. 6A and 6B, respectively.
Figure 7B:
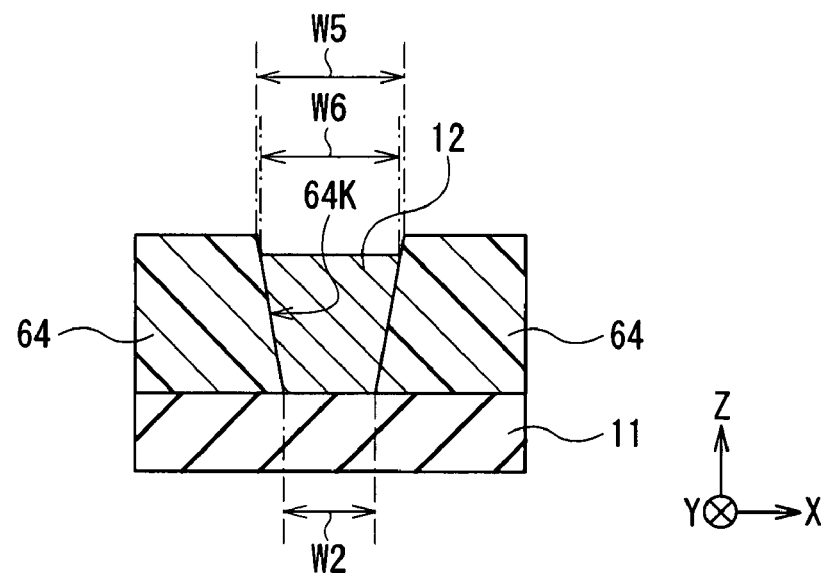

Subsequently, as shown in FIGS. 7A and 7B, the main magnetic pole layer 12 is formed at the opening part 64K of the photoresist pattern 64 by using, for example, plating method or sputtering method. In this case, it is controlled so that, for example, the upper end width of the main magnetic pole layer 12 can become a width W6 larger than the width W1 (FIG. 3) and smaller than the width W5. The lower end width of the main magnetic pole layer 12 becomes the width W2. When plating method is used to form the main magnetic pole layer 12, for example, a seed layer is formed before forming a photoresist pattern 64 on the insulating layer 11. After forming the photoresist pattern 64, the seed layer is used to grow a plated film. Thereafter, as shown in FIGS. 8A and 8B, the photoresist pattern 64 is removed by using ashing method, for example. When plating method is used, the unnecessary portion of the seed layer is removed by dry etching, for example.

Finally, as shown in FIGS. 9A and 9B, after an insulting layer 13 is formed so as to cover the main magnetic pole layer 12 and its periphery, for example, with CMP method, the insulating layer 13 is polished until at least the main magnetic pole layer 12 is exposed, so that the insulating layer 13 can be buried around the main magnetic pole layer 12. In this case, the amount of polishing is adjusted so that the upper end width of the main magnetic layer 12 can be equal to the width W1 by, for example, polishing the main magnetic pole layer 12 along with the insulating layer 13. Thus, the process of forming the main magnetic layer 12 using the photoresist pattern 64 is completed.

In the method of manufacturing a thin film magnetic head according to the present embodiment, the mask 62 having the projected part 62T at the position P2 is used to expose and develop the photoresist film 61 (FIGS. 4A and 4B), thereby forming the preparatory photoresist pattern 63 having the projected part 63T at the position P3 (FIGS. 5A and 5B). Subsequently, the preparatory photoresist pattern 63 is heated to remove the projected part 63T, thereby forming the photoresist pattern 64 having no projected part at the position P4 (FIGS. 6A and 6B). In this case, the formation of the main magnetic pole layer 12 by using the photoresist pattern 64 enables the three dimensional shape of the photoresist pattern 64 to be controlled sufficiently for the following reason. This enables the main magnetic pole layer 12 to be formed with high accuracy.

Figure 11A:
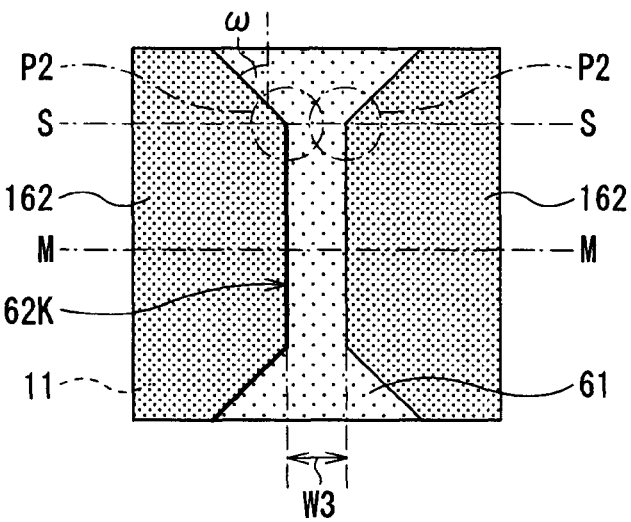
FIGS. 11A to 11C are plan views each explaining a method of manufacturing a thin film magnetic head as a first comparative example.
Figure 11B:
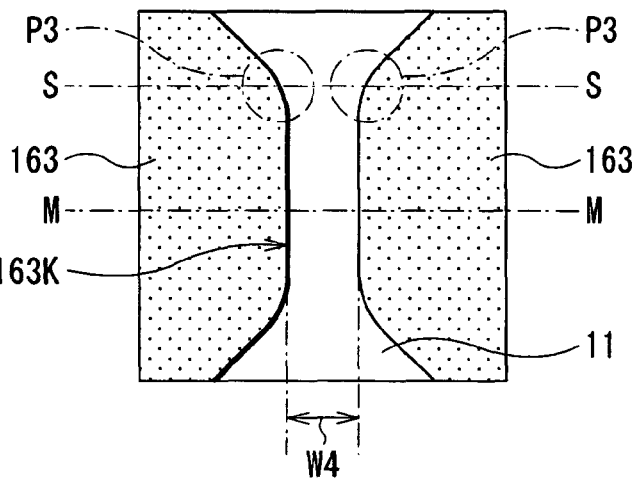
Figure 11C:
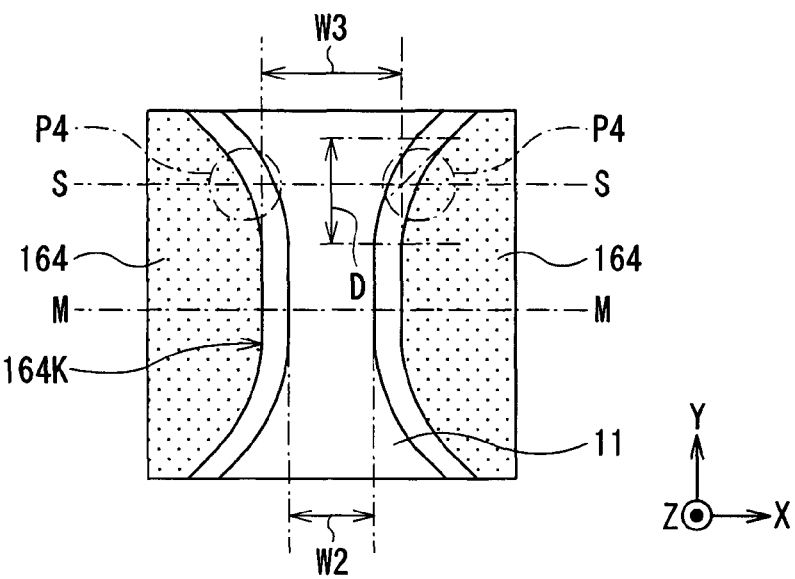
Figure 12A:
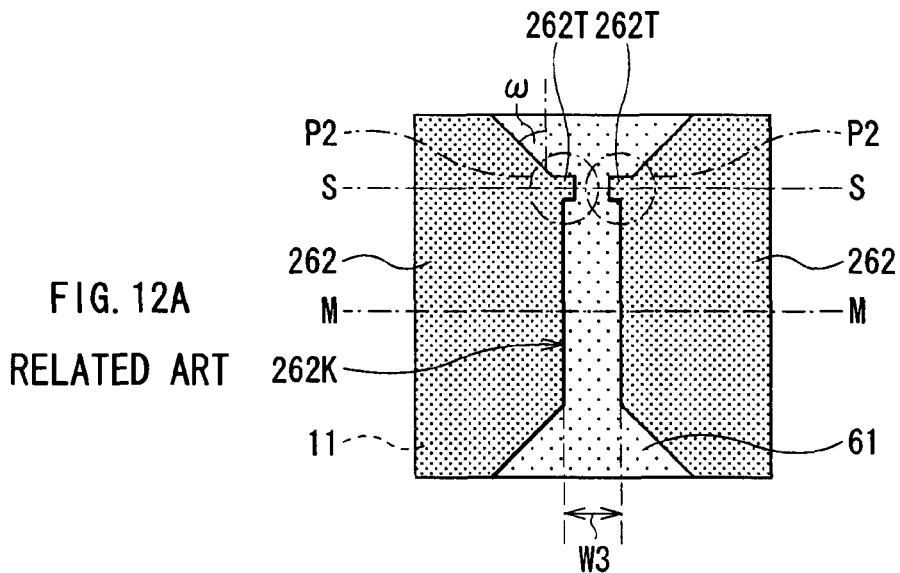
FIGS. 12A to 12C are plan views each explaining a method of manufacturing a thin film magnetic head as a second comparative example.
Figure 12B:
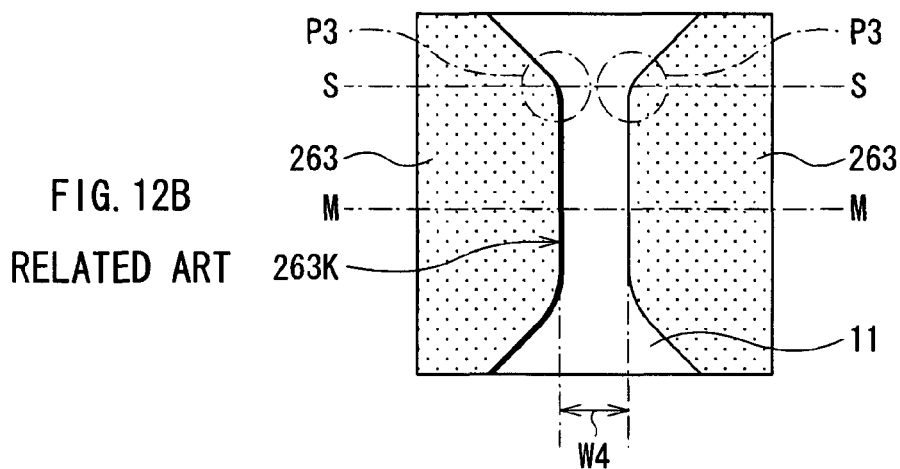
Figure 12C:
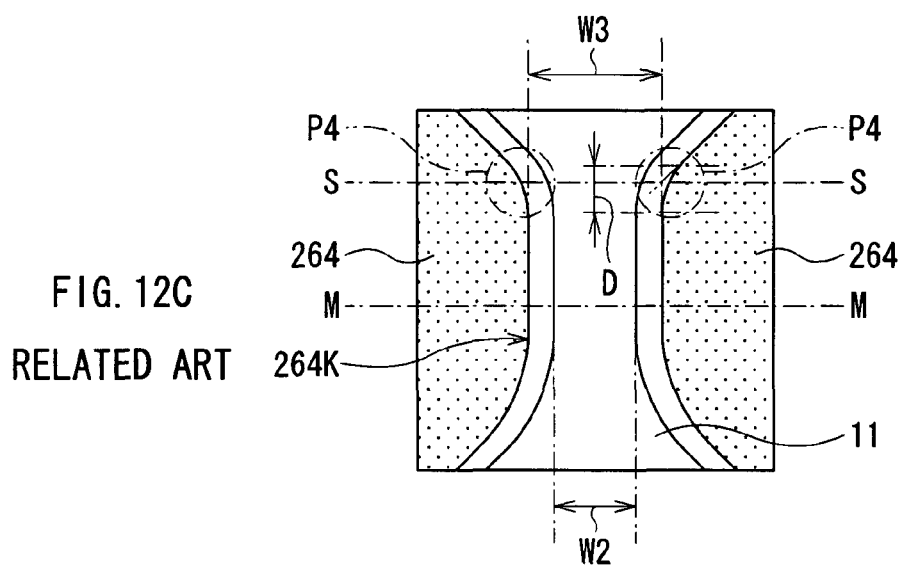

FIGS. 11A to 11C and FIGS. 12A to 12C are for purposes of explaining methods of manufacturing a thin film magnetic head according to first and second comparative examples, respectively. FIGS. 11A and 12A, FIGS. 11B and 12B, and FIGS. 11C and 12C show the plan configurations corresponding to FIG. 4A, FIG. 5A, and FIG. 6A, respectively. In the first comparative example (FIGS. 11A to 11C), a mask 162 having no projected part at a position P2 (FIG. 11A) is used to form a preparatory photoresist pattern 163 having no projected part at a position P3 (FIG. 11B), and then a photoresist pattern 164 is formed (FIG. 11C). In the second comparative example (FIGS. 12A to 12C), a mask 262 having a projected part 262T at a position P2 (FIG. 12A) is used to form a preparatory photoresist pattern 263 having no projected part at a position P3 (FIG. 12B), and then a photoresist pattern 264 is formed (FIG. 12C). In the first and second comparative examples, the masks 162 and 262, the preparatory photoresist patterns 163 and 263, and the photoresist patterns 164 and 264 correspond to the mask 62, the preparatory photoresist pattern 63, and the photoresist pattern 64, respectively. The procedure other than the above-mentioned manufacturing steps is the same as that in the first preferred embodiment.

In the first comparative example (FIGS. 11A to 11C), the mask 162 has no projected part at the position P2 (FIG. 11A), and hence no projected part can be formed at the position P3 of the preparatory photoresist pattern 163 (FIG. 11B). In this case, the influences of the diffraction phenomenon of light in the photolithography process and the thermal contraction of the preparatory photoresist pattern 163 in the heating process cannot be relaxed at all. Therefore, the photoresist pattern 164 will be remarkably rounded at the position P4, thereby significantly increasing the rounding range D (FIG. 11C). Consequently, when the photoresist pattern 164 is used to form a main magnetic pole layer 12, there is a likelihood that the width of the main magnetic pole layer 12 will be too increased so as to exceed a design value (the width W1 in FIG. 3) at the flare point FP.

In the second comparative example (FIGS. 12A to 12C), though the mask 262 has the projected part 262T at the position P2 (FIG. 12A), the projected part 262T does not have a sufficient dimension, so that no projected part can be formed at the position P3 of the preparatory photoresist pattern 263

(FIG. 12B). In this case, though the influence of the diffraction phenomenon of light in the photolithography process can be relaxed by the presence of the projected part 262T, the influence of the thermal contraction of the preparatory photoresist pattern 263 in the heating process cannot be relaxed. Hence, the photoresist pattern 264 is greatly rounded at the position P4, thereby increasing the rounding range D (FIG. 12C). Although this rounding range D is smaller than that in the first comparative example, it cannot be said to be sufficiently small. Thus, there is a likelihood that the width of the main magnetic pole layer 12 formed by using the photoresist pattern 264 will be too increased than a design value at the flare point FP.

On the other hand, in the first preferred embodiment (FIG. 4A to FIG. 6B), the mask 62 has the projected part 62T having a sufficient dimension at the position P2 (FIG. 4A), so that the projected part 63T can be formed at the position P3 of the preparatory photoresist pattern 63 (FIG. 5A). In this case, the presence of the projected part 62T relaxes the influence of the diffraction phenomenon of light in the photolithography process, and the presence of the projected part 63T relaxes the influence of the thermal contraction of the preparatory photoresist pattern 63 in the heating process. Therefore, the photoresist pattern 64 is hard to be rounded at the position P4, so that the rounding range D can be significantly reduced than the first and second comparative examples (FIG. 6A). Additionally, the preparatory photoresist pattern 63 is thermally flown and thermally deformed in the heating process, so that the inner wall in the opening part 63K can be inclined and the projected part 63T can be retreated and vanish (FIGS. 5A to 6B). Thus, since the three dimensional shape of the photoresist pattern 64 approaches the desired three dimensional shape, the width at the flare point FP can approach the design value in the main magnetic pole layer 12 formed by using the photoresist pattern 64. Consequently, the three dimensional shape of the photoresist pattern 64 can be controlled sufficiently, thus enabling the main magnetic pole layer 12 to be formed with high accuracy.

The followings are the technical significance of the present invention. That is, as a method of controlling the three dimensional shape of a photoresist pattern by compensating for the resolution limit of an exposure system, the technique of using the mask provided with a projected part (a serif) of the related art is already known as described in the background art. However, the projected part in the mask of the related art is provided only for relaxing the influence of the diffraction phenomenon of light in the photolithography process, not for relaxing both of the influences of the diffraction phenomenon of light in the photolithography process and the thermal contraction in the heating process which are achieved by the mask 62 in the present embodiment as shown in FIGS. 4 and 4B, for example. When using the mask of the related art provided with the projected part in consideration of only the influence of the diffraction phenomenon of light in the photolithography process, the photoresist pattern is formed by using this mask (without passing through the step of forming a preparatory photoresist pattern), and therefore any projected part should not remain in this photoresist pattern. Needless to say, as in the preparatory photoresist pattern 63 (FIGS. 5A and 5B) of the present invention, no projected part will be provided in a photoresist pattern in the middle of the formation thereof. From these, the technical significance of the present invention is to intentionally provide the projected part in the photoresist pattern (the preparatory photoresist pattern 63) in the middle of the formation thereof, for the purpose of relaxing the deformation in the photolithography process and the heating process.

Figure 13A:
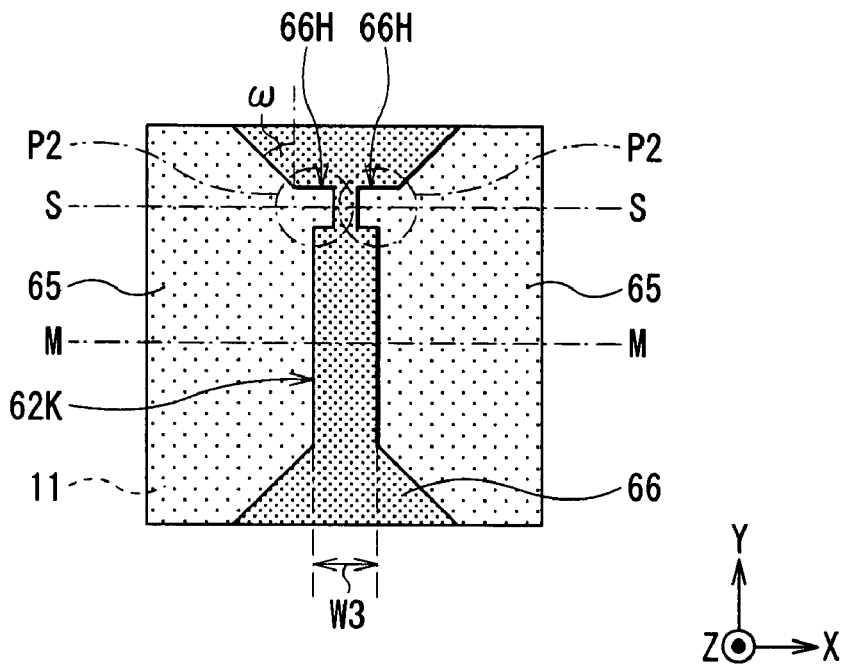
FIGS. 13A and 13B are a plan view and a sectional view for explaining a modification in respect to the method of manufacturing a thin film magnetic head, respectively.
Figure 13B:
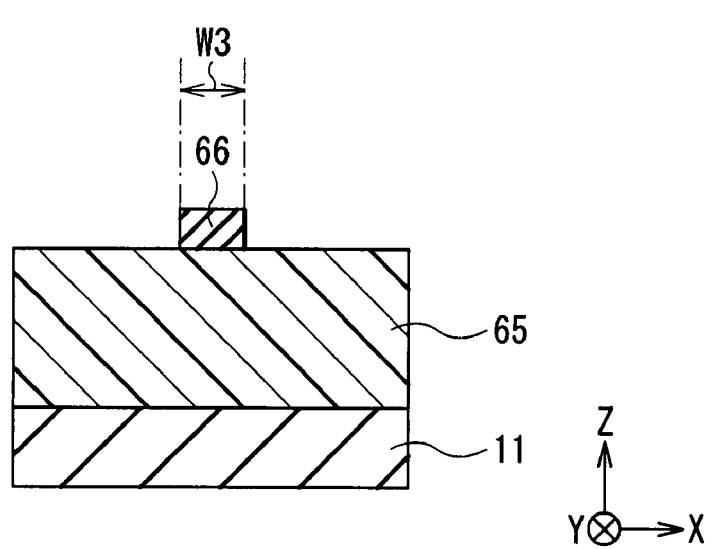

Although the first preferred embodiment uses, as shown in FIGS. 4A and 4B, the positive type photoresist (the photoresist film 61) and the open type mask (the mask 62) in order to form the preparatory photoresist pattern 63 (FIGS. 5A and 5B) and the photoresist pattern 64 (FIGS. 6A and 6B), it is not necessarily limited to this. For example, as shown in FIGS. 13A and 13B corresponding to FIGS. 4A and 4B, respectively, the negative type photoresist (the photoresist film 65) and the isolation type of mask (the mask 66) may be used. In this case, after forming a photoresist film 65 by applying a negative type photoresist, the mask 66 is disposed on the photoresist film 65. The mask 66 has a pattern shape that the opening part 62K and the non-opening part in the mask 62 are reversed to each other, and has a notch part 66H at the position P2, instead of the projected part 62T. The procedure after the photolithography process using the photoresist film 61 and the mask 66 is the same as the case of using the photoresist film 61 and the mask 62. Also in this case, the preparatory photoresist pattern 63 and the photoresist pattern 64 as shown in FIGS. 5A and 5B, and FIGS. 6A and 6B, respectively, can be formed, thus enabling the same effect to be obtained.

Although in the first preferred embodiment, as shown in FIG. 10, the center of the projected part pattern S of square type is positioned at the salient point C when defining the contour of the projected part 62T, it is not necessarily limited to this. For example, the pattern shape of the projected part pattern S, and the positional relationship between the reference mask N and the projected part pattern S can be set arbitrarily.

Although the first preferred embodiment has described the case of applying the method of forming a photoresist pattern to the method of manufacturing a perpendicular magnetic recording head, it is not necessarily limited to this. For example, it may be applied to a method of manufacturing other various devices other than the perpendicular magnetic recording head. The application of the photoresist pattern in this case is not limited to the process of forming various pattern films, such as the above-mentioned main magnetic pole layer 12 and the like. For example, it may be applied to various types of selective processes such as etching process and doping process. This also enables the same effect to be obtained.

Second Preferred Embodiment

Figure 14A:
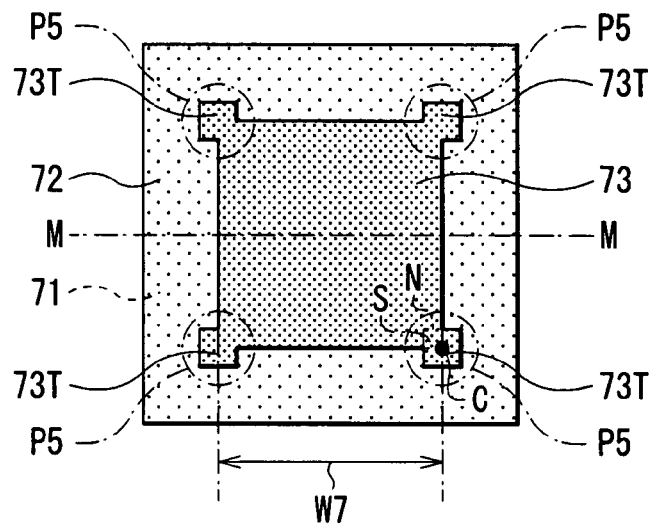
FIGS. 14A to 14C are plan views each explaining a method of forming a photoresist pattern according to a second preferred embodiment of the present invention.
Figure 14B:
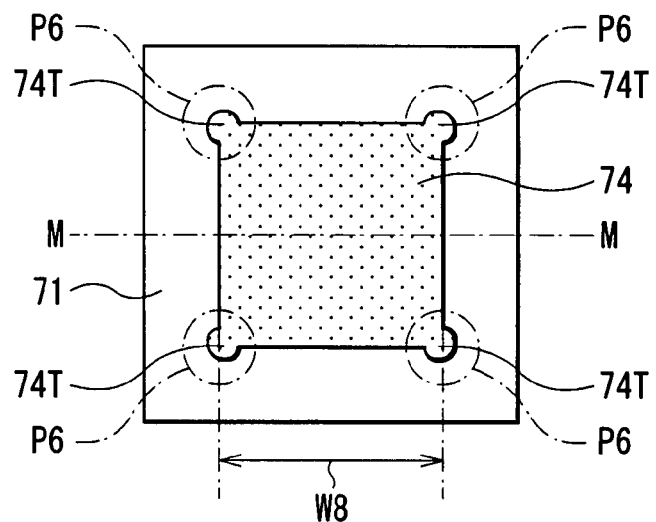
Figure 14C:
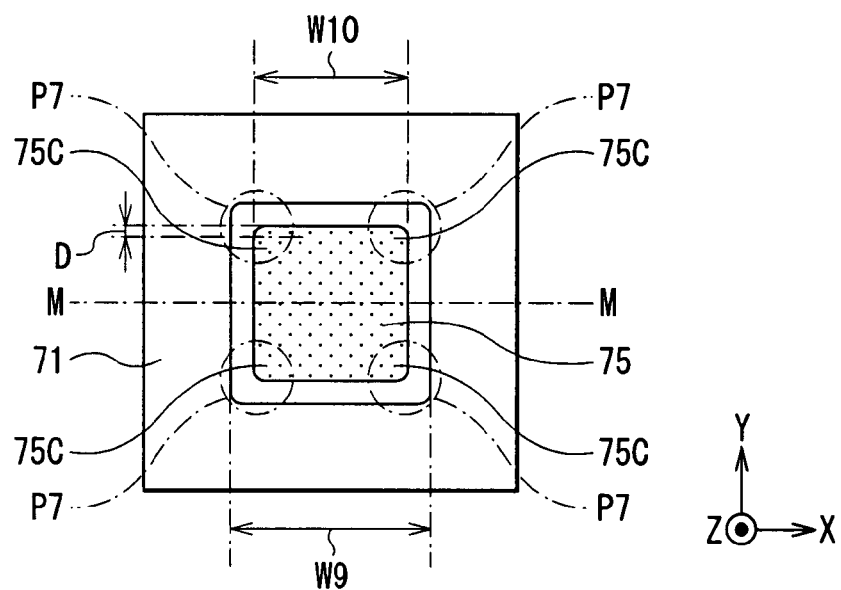
Figure 15A:
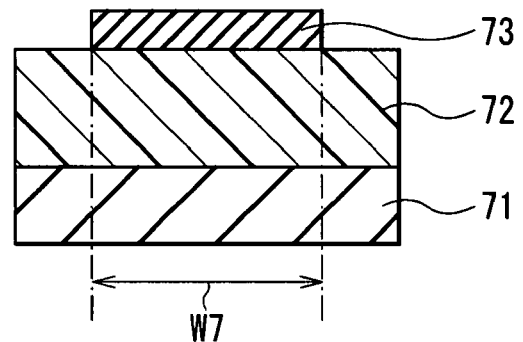
FIGS. 15A to 15C are sectional views corresponding to FIGS. 14A to 14C, respectively.
Figure 15B:
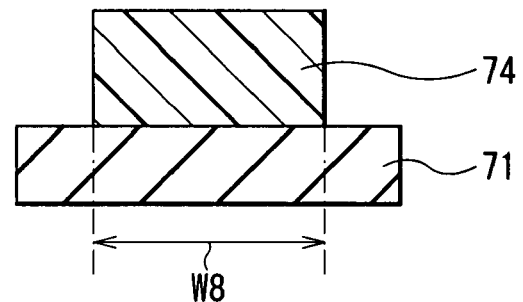
Figure 15C:
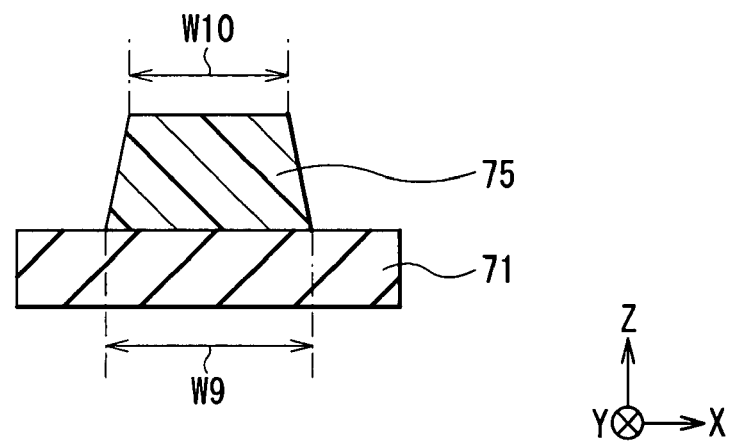

FIGS. 14A to 14C and FIGS. 15A to 15C are for purposes of explaining a method of forming a photoresist pattern according to a second preferred embodiment, and show plan configurations and sectional configurations, respectively. FIGS. 15A to 15C show the cross sections taken along the line M-M in FIGS. 14A to 14C, respectively.

Unlike the first preferred embodiment of forming the photoresist pattern 64 of the open type (FIGS. 6A and 6B), the method of forming a photoresist pattern in the second preferred embodiment is to form a photoresist pattern 75 of the isolation type (FIGS. 14C and 15C). The photoresist pattern 75 can be used in the processes of forming various kinds of pattern films and various selective processes, for example, in the field of manufacturing various kinds of devices including perpendicular magnetic recording heads.

When forming the photoresist pattern 75, firstly, as shown in FIGS. 14A and 15A, a photoresist film 72 is formed by applying a positive type photoresist onto the surface of a base 71 with the use of spin coating method, for example. Thereafter, a mask 73 for exposure (a width W7 in the smallest width region) is disposed on the photoresist film 72. The mask 73 is an isolation type of mask reflecting the pattern shape of the photoresist pattern 75 to be formed in the post-process, and has a projected part 73T at a position P5 corresponding to a convex-shaped corner part 75C (a position P7) of the photoresist pattern 75. The principle of defining the contour of the projected part 73T to be defined based on the positional relationship between a reference mask N (a salient point C) and a projected part pattern S is the same as in the case described with respect to the projected part 62T in the first preferred embodiment. In an alternative, the base 71 may be one of various substrates or various films.

Subsequently, as shown in FIGS. 14B and 15B, a preparatory photoresist pattern 74 (a width W8 in the smallest width region) is formed by exposing and developing the photoresist film 72 with the use of photolithography method. In the photolithography process, a projected part 74T is disposed so as to be rounded at a position P6 corresponding to the projected part 73T (a position P5) in the mask 73. The dimensional relationship between the widths W7 and W8 before and after exposure can be adjusted arbitrarily according to the photoresist print conditions such as the amount of exposure.

Subsequently, the preparatory photoresist pattern 74 is heated to form the photoresist pattern 75 as shown in FIGS. 14C and 15C. In this heating process, the preparatory photoresist pattern 74 is subjected to the influence of surface tension thereby to cause thermal flow and thermal contraction, so that the outer wall can be inclined and the projected part 74T can be retreated and then vanish. Thus, the photoresist pattern 75 becomes narrower gradually with increasing the distance between the photoresist pattern 75 and the base 71. That is, the lower end width of the photoresist pattern 75 becomes a width W9 smaller than the above-mentioned width W8, and the upper end width thereof becomes a width W10 smaller than the lower end width W9. Further, the vanishment of the projected part 74T enables the corner part 75C at the position P7 to be nearly sharp. Thus, the process of forming the photoresist pattern 75 is completed.

In the method of forming a photoresist pattern according to the second preferred embodiment, the mask 73 having the projected part 73T at the position P5 is used to expose and develop the photoresist film 72 (FIGS. 14A and 15B), thereby forming the preparatory photoresist pattern 74 having the projected part 74T at the position P6 (FIGS. 14B and 15B). Subsequently, the preparatory photoresist pattern 74 is heated to remove the projected part 74T, thereby forming the photoresist pattern 75 having no projected part at the position P7 (FIGS. 14C and 15C). In this case, the rounding range D can be reduced significantly by the same operation as in the foregoing first preferred embodiment. This enables the three dimensional shape of the photoresist pattern 75 to be controlled sufficiently as compared with the case where any projected part is provided in neither the mask nor the preparatory photoresist pattern, or the case where the projected part is provided only in the mask and no projected part is provided in the preparatory photoresist pattern. Hence, the process of forming various pattern films and the various selective processes, each using the photoresist pattern 75, can be performed with high accuracy.

Figure 16A:
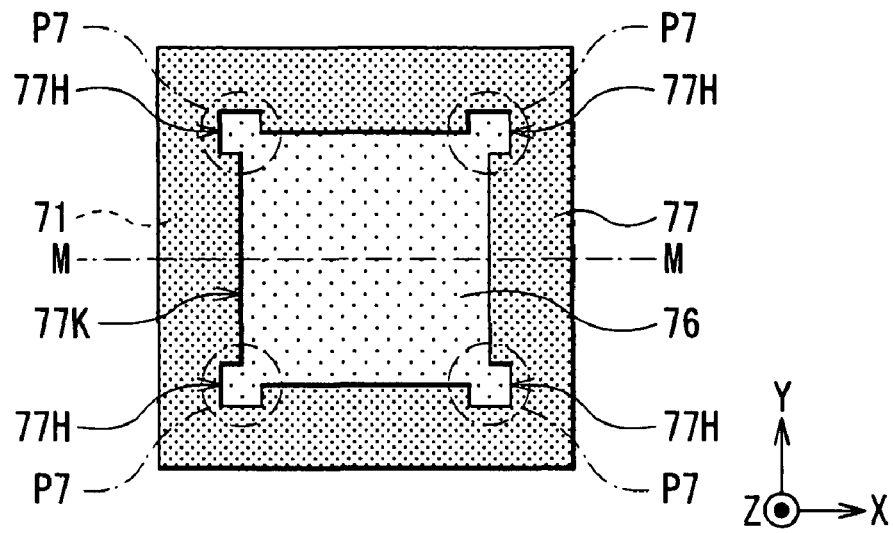
FIGS. 16A and 16B are a plan view and a sectional view for explaining a modification in respect to the method of forming a photoresist pattern, respectively.
Figure 16B:
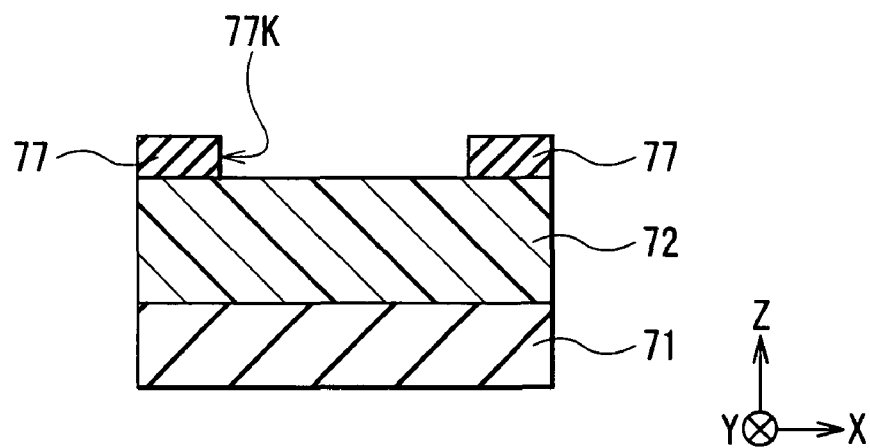

Although the second preferred embodiment uses, as shown in FIGS. 14A to 15C, the positive type photoresist (the photoresist film 72) and the isolation type of mask (the mask 73) in order to form the preparatory photoresist pattern 74 and the photoresist pattern 75, it is not necessarily limited to this. For example, as shown in FIGS. 16A and 16B corresponding to FIGS. 14A and 15A, respectively, a negative type photoresist (a photoresist film 76) and an open type mask (a mask 77) may be used. In this case, after forming the photoresist film 76 by applying the negative type photoresist, the mask 77 having an opening part 77K is disposed on the photoresist film 76.

The mask 77 has a pattern shape that the isolated pattern part and the non-isolated pattern part in the mask 73 are reversed to each other, and has a notch part 77H at the position P7. The procedure after the photolithography process using the photoresist film 76 and the mask 77 is the same as the case of using the photoresist film 72 and the mask 73. Also in this case, the preparatory photoresist pattern 74 and the photoresist pattern 75 as shown in FIGS. 14B and 14CA and FIGS. 15B and 15C, respectively, can be formed, thus enabling the same effect to be obtained.

The procedure, operation and modifications other than the above description in respect to the method of forming a photoresist pattern of the second preferred embodiment are the same as in the first preferred embodiment.

Third Preferred Embodiment

Figure 17A:
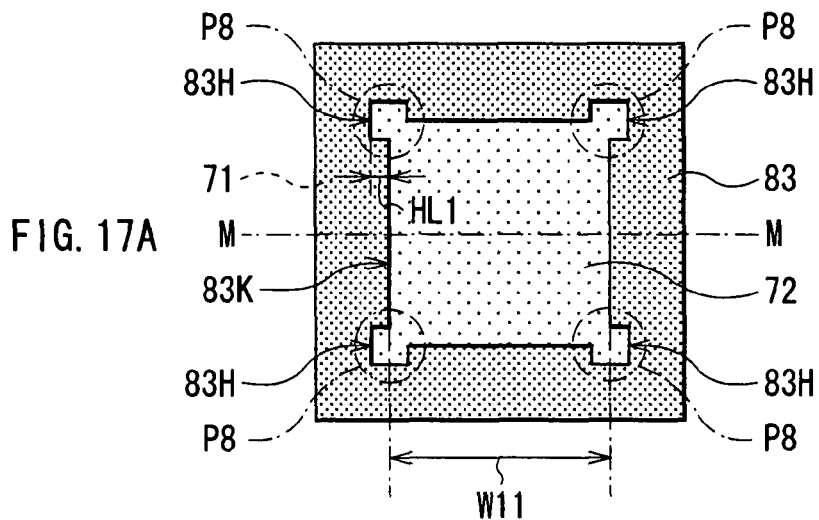
FIGS. 17A to 17C are plan views each explaining a method of forming a photoresist pattern according to a third preferred embodiment of the present invention.
Figure 17B:
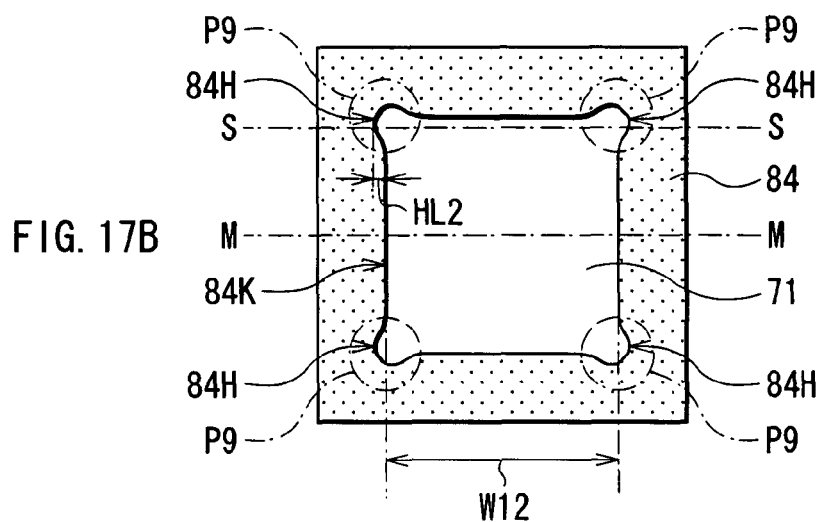
Figure 17C:
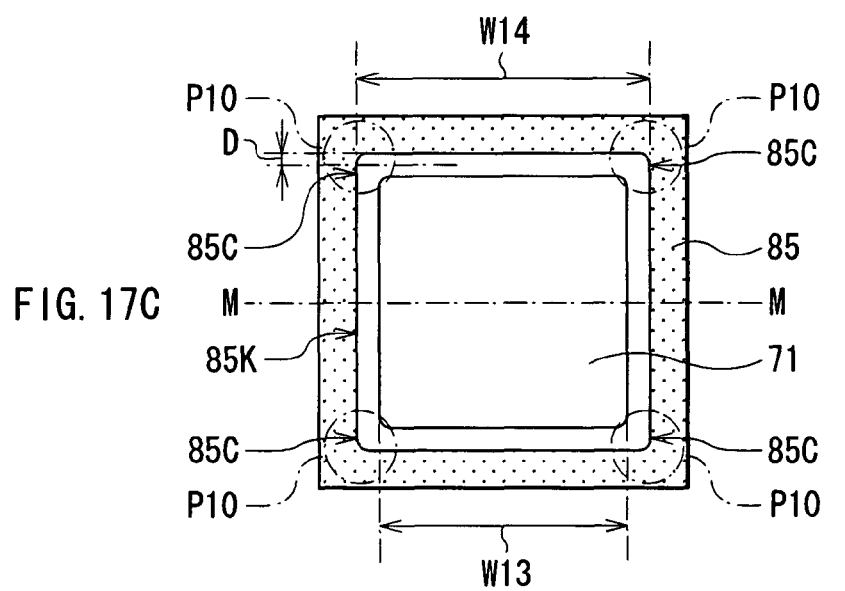
Figure 18A:
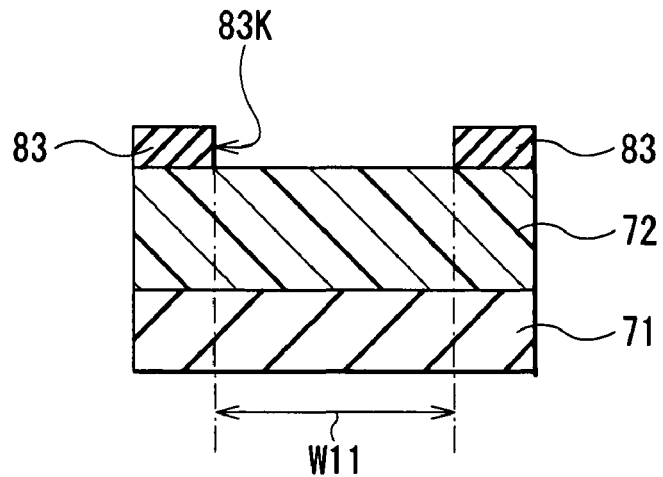
FIGS. 18A to 18C are sectional views corresponding to FIGS. 17A to 17C, respectively.
Figure 18B:
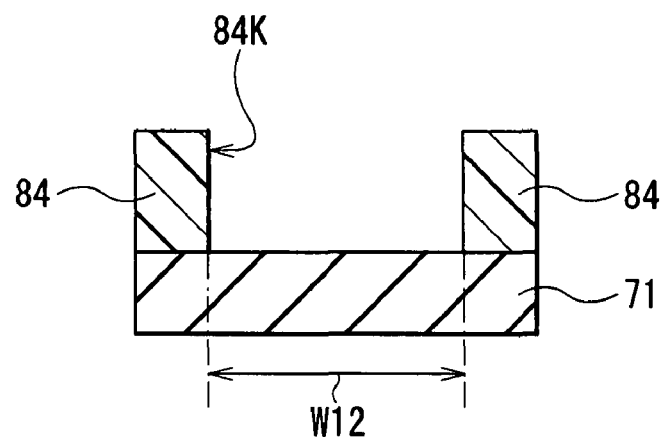
Figure 18C:
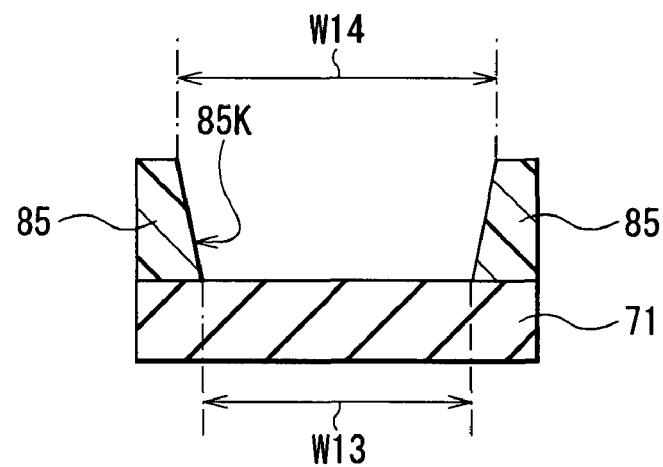

FIGS. 17A to 17C and FIGS. 18A to 18C are for purposes of explaining a method of forming a photoresist pattern according to a third preferred embodiment, and show plan configurations and sectional configurations, respectively. FIGS. 18A to 18C show the cross sections taken along the line M-M in FIGS. 17A to 17C, respectively. In FIGS. 17A to 18C, the same components as those described in the second preferred embodiment have similar reference numerals.

Unlike the second preferred embodiment of forming the photoresist pattern 75 of the isolation type, the method of forming a photoresist pattern in the third preferred embodiment is to form a photoresist pattern 85 of the open type (FIGS. 17C and 18C).

When forming the photoresist pattern 85, firstly, as shown in FIGS. 17A and 18A, a photoresist film 72 is formed on a base 71 by taking the procedure as described in the second preferred embodiment. Thereafter, a mask 83 for exposure is disposed on the photoresist film 72. The mask 83 is an open type mask having an opening part 83K (a width W11 in the smallest width region) reflecting the pattern shape of the photoresist pattern 85 to be formed in the post-process, and has a notch part 83H (a notch depth HL1) at a position P8 corresponding to a concave-shaped corner part 85C (a position P10) in the photoresist pattern 85. The principle of defining the contour of the notch part 83H is the same as in the case with the notch part 66H described with reference to FIGS. 13A and 13B in the first preferred embodiment.

Subsequently, as shown in FIGS. 17B and 18B, a preparatory photoresist pattern 84 having an opening part 84K (a width W12 in the smallest width region) is formed by exposing and developing the photoresist film 72 with the use of photolithography method. In the photolithography process, a notch part 84H (a notch depth HL2) is disposed so as to be rounded at a position P9 corresponding to the notch part 83H (the position P8) in the mask 83. The dimensional relationship between the widths W11 and W12, and the dimensional relationship between the notch depths HL1 and HL2 before and after exposure can be adjusted arbitrarily according to the photoresist print conditions such as the amount of exposure.

Subsequently, the preparatory photoresist pattern 84 is heated to form the photoresist pattern 85 having an opening part 85K as shown in FIGS. 17C and 18C. In this heating process, the preparatory photoresist pattern 84 is subjected to the influence of surface tension thereby to cause thermal flow and thermal contraction, so that the inner wall can be inclined and the notch part 84H can vanish. Thus, the opening part 85K becomes wider gradually with increasing the distance between the opening part 85K and the base 71. That is, the lower end width of the opening part 85K becomes a width W13 larger than the above-mentioned width W12, and the upper end width thereof becomes a width W14 larger than the lower end width W13. Further, the vanishment of the notch part 84H enables the corner part 85C at the position P10 to be nearly sharp. Thus, the process of forming the photoresist pattern 85 is completed.

In the method of forming a photoresist pattern according to the third preferred embodiment, the mask 83 having the notch part 83H at the position P8 is used to expose and develop the photoresist film 72 (FIGS. 17A and 18A), thereby forming the preparatory photoresist pattern 84 having the notch part 84H at the position P9 (FIGS. 17B and 18B). Subsequently, the preparatory photoresist pattern 84 is heated to remove the notch part 84H, thereby forming the photoresist pattern 85 having no notch part at the position P10 (FIGS. 17C and 18C). In this case, the three dimensional shape of the photoresist pattern 85 can be controlled sufficiently for the following reason.

Figure 19A:
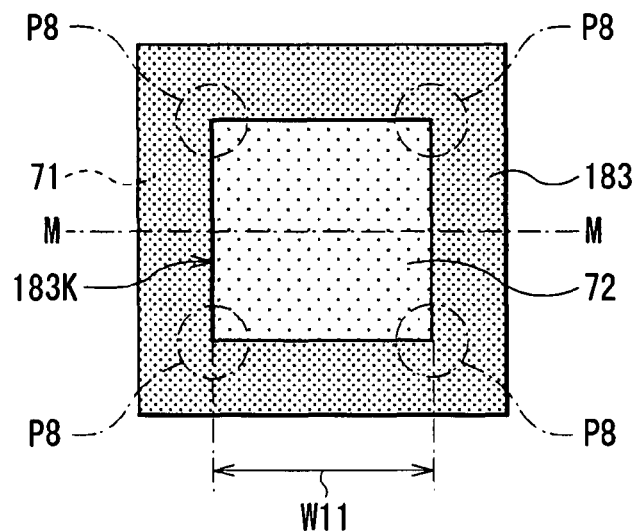
FIGS. 19A to 19C are plan views each explaining a method of forming a photoresist pattern in a first comparative example.
Figure 19B:
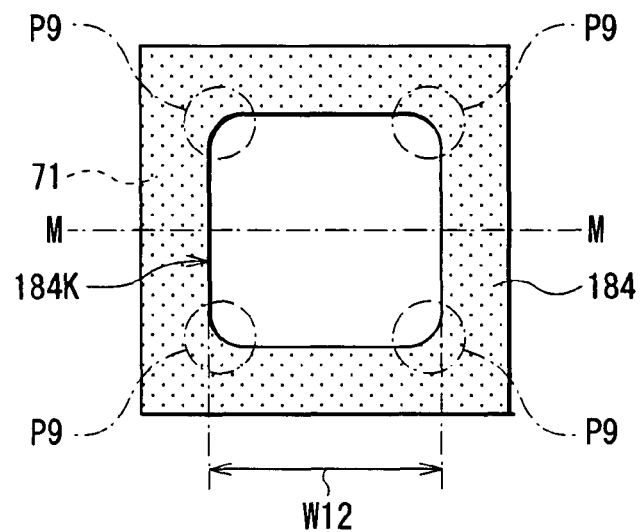
Figure 19C:
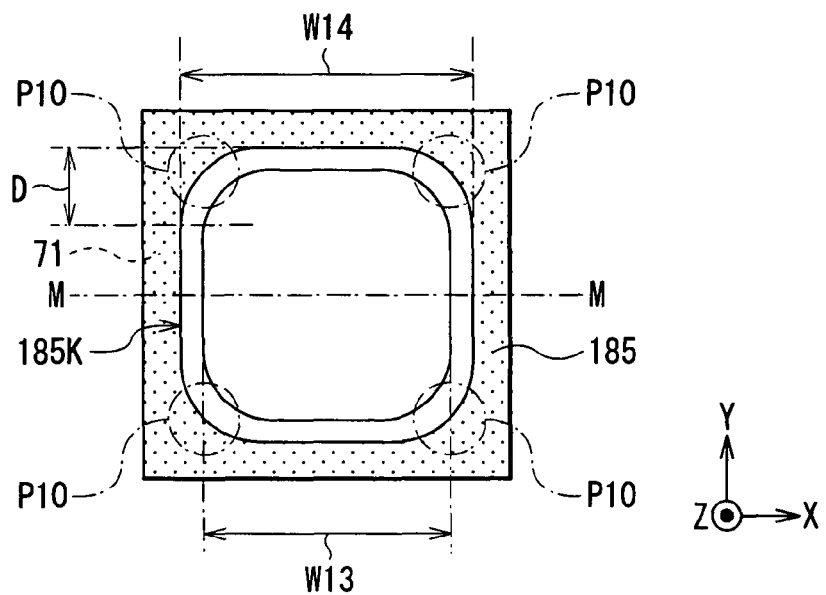
Figure 20A:
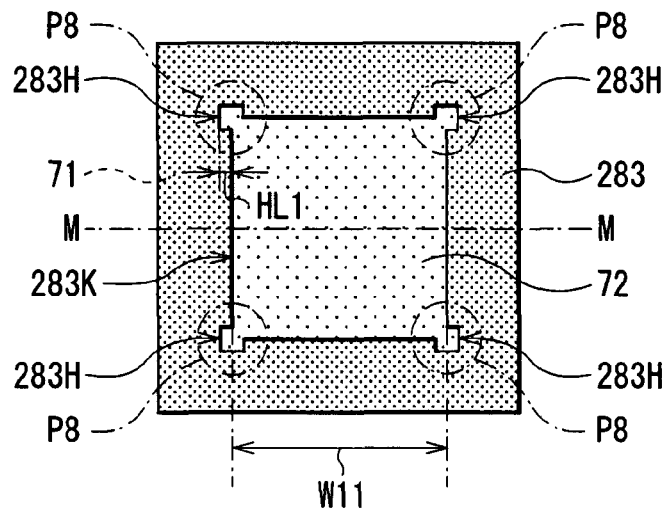
FIGS. 20A to 20C are plan views each explaining a method of forming a photoresist pattern in a second comparative example.
Figure 20B:
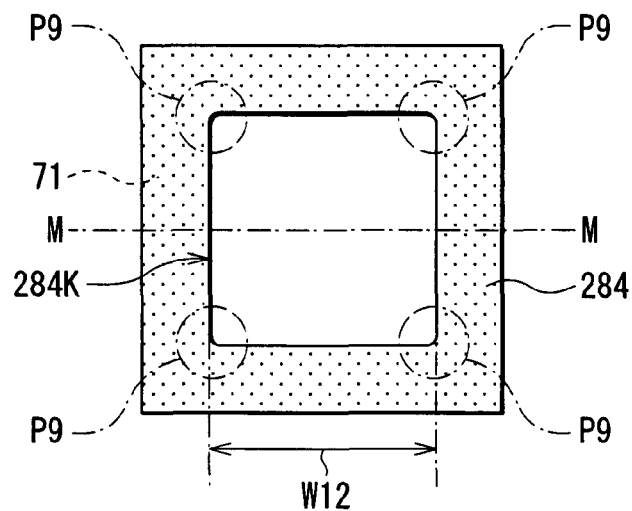
Figure 20C:
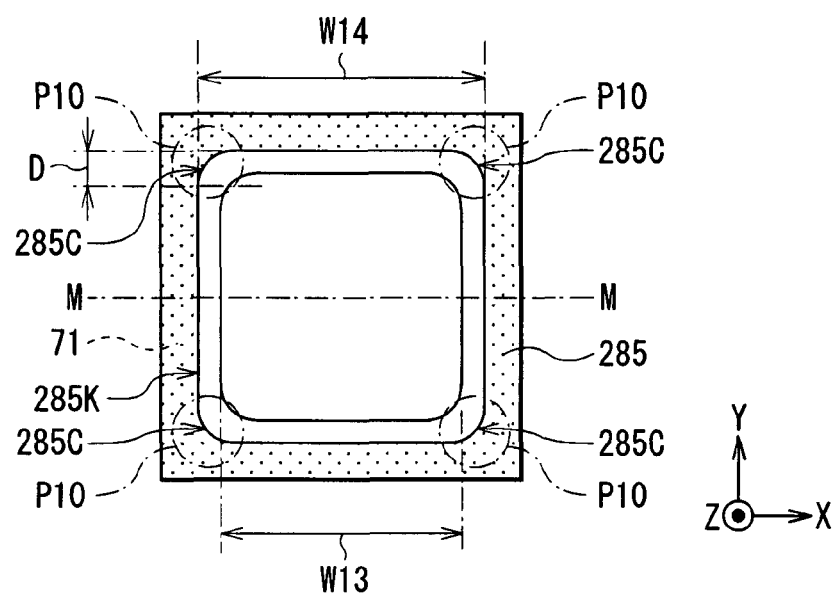

FIGS. 19A to 19C and FIGS. 20A to 20C are for purposes of explaining methods of manufacturing a photoresist pattern according to first and second comparative examples, respectively. FIGS. 19A and 20A, FIGS. 19B and 20B, and FIGS. 19C and 20C show the plan configurations corresponding to FIG. 17A to 17C, respectively. In the first comparative example (FIGS. 19A to 19C), a mask 183 having no notch part at a position P8 (FIG. 19A) is used to form a preparatory photoresist pattern 184 having no notch part at a position P9 (FIG. 19B), and then a photoresist pattern 185 is formed (FIG. 19C). In the second comparative example (FIGS. 20A to 20C), a mask 283 having a notch part 283H at a position P8 (FIG. 20A) is used to form a preparatory photoresist pattern 284 having no notch part at a position P9 (FIG. 20B), and then a photoresist pattern 285 is formed (FIG. 20C). The sectional configurations taken along the line M-M shown in FIGS. 19A to 19C and FIGS. 20A to 20C are the same as the sectional configurations shown in FIGS. 18A to 18C, respectively. In the first and second comparative examples, the masks 183 and 283, the preparatory photoresist patterns 184 and 284, and the photoresist patterns 185 and 285 correspond to the mask 83, the preparatory photoresist pattern 84, and the photoresist pattern 85, respectively. The procedure other than the above-mentioned manufacturing steps is the same as that in the third preferred embodiment.

In the first comparative example (FIGS. 19A to 19C), the mask 183 has no notch part at the position P8 (FIG. 19A), and therefore no notch part can be formed at the position P9 in the preparatory photoresist pattern 184 (FIG. 19B). In this case, the influences of the diffraction phenomenon of light in the photolithography process and the thermal contraction of the preparatory photoresist pattern 184 in the heating process cannot be relaxed at all. As the result, the photoresist pattern 185 is remarkably rounded at the position P10, thereby significantly increasing the rounding range D (FIG. 19C).

In the second comparative example (FIGS. 20A to 20C), though the mask 283 has the notch part 283H at the position P8 (FIG. 20A), the notch part 283H does not have a sufficient dimension, so that no notch part can be formed at the position P9 of the preparatory photoresist pattern 284 (FIG. 20B). In this case, though the influence of the diffraction phenomenon of light in the photolithography process can be relaxed by the presence of the notch part 283H, the influence of the thermal contraction of the preparatory photoresist pattern 284 in the heating process cannot be relaxed. As the result, the photoresist pattern 285 is greatly rounded at the position P10, thereby increasing the rounding range D (FIG. 20C). Although this rounding range D is smaller than that in the first comparative example, it is not sufficiently small.

On the other hand, in the third preferred embodiment (FIG. 17A to FIG. 18C), the mask 83 has the notch part 83H having a sufficient dimension at the position P8 (FIG. 17A), and hence the notch part 84H can be formed at the position P9 of the preparatory photoresist pattern 284 (FIG. 17B). In this case, the presence of the notch part 83H relaxes the influence of the diffraction phenomenon of light in the photolithography process, and the presence of the notch part 83H relaxes the influence of the thermal contraction of the preparatory photoresist pattern 84 in the heating process. Therefore, the photoresist pattern 85 is hard to be rounded at the position P10, so that the rounding range D can be significantly reduced than the first and second comparative examples (FIG. 17C). Additionally, the preparatory photoresist pattern 84 can be thermally flown and thermally deformed in the heating process, so that the inner wall in the opening part 84K can be inclined and the notch part 84H can vanish. Hence, the three dimensional shape of the photoresist pattern 85 approaches the desired three dimensional shape, enabling the three dimensional shape of the photoresist pattern 85 to be controlled sufficiently.

Figure 21A:
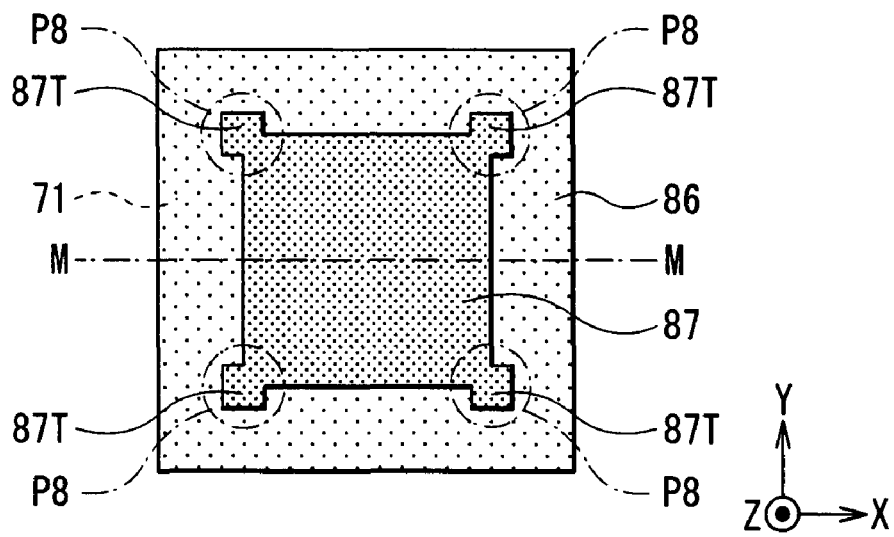
FIGS. 21A and 21B are a plan view and a sectional view for explaining a modification in respect to the method of forming a photoresist pattern, respectively.
Figure 21B:
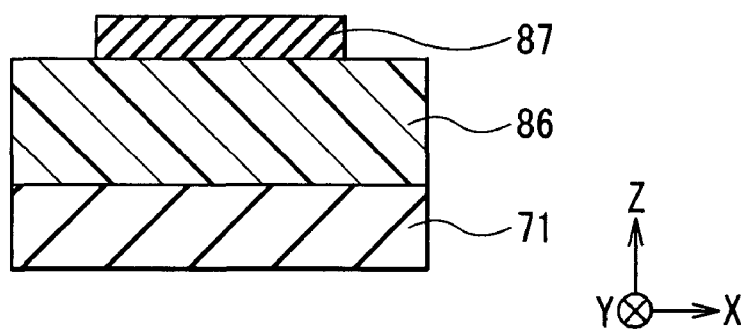

Although the third preferred embodiment uses, as shown in FIGS. 17A to 18C, the positive type photoresist (the photoresist film 72) and the open type mask (the mask 83) in order to form the preparatory photoresist pattern 84 and the photoresist pattern 85, it is not necessarily limited to this. For example, as shown in FIGS. 21A and 21B corresponding to FIGS. 17A and 18A, respectively, a negative type photoresist (a photoresist film 86) and an isolation type of mask (a mask 87) may be used. In this case, after forming the photoresist film 86 by applying the negative type photoresist, the mask 87 is disposed on the photoresist film 86. The mask 87 has a pattern shape that the opening part 83K and the non-opening part in the mask 83 are reversed to each other, and has a projected part 87T at the position P8, instead of the notch part 83H. The procedure after the photolithography process using the photoresist film 86 and the mask 87 is the same as the case of using the photoresist film 72 and the mask 83. Also in this case, the preparatory photoresist pattern 84 and the photoresist pattern 85 as shown in FIGS. 17A to 17C and FIGS. 18 to 18C, respectively, can be formed, thus enabling the same effect to be obtained.

EXAMPLES

Examples of the present invention will be described below.

First, the method of forming a photoresist pattern as described in the first preferred embodiment was used to form photoresist patterns. The results are presented in Table 1. Table 1 shows the dimensions of respective parts in the steps of forming the photoresist pattern, such as the projection length TL1 (nm) of the mask, the projection length TL2 (nm) of the preparatory photoresist pattern, and the rounding range D (nm) of the photoresist pattern. In Table 1, the dimensions of the respective parts in the first and second comparative examples shown in FIGS. 11A to 12C are also presented in order to compare and evaluate the dimensions of the respective parts of the present invention.

The respective photoresist patterns were formed in the following procedure. First, with spin coating method, a photoresist film was formed so as to have a thickness of 0.5 μm by applying a positive type photoresist AZ5105P, manufactured by AZ Electronic Materials Company Limited, to the surface of a silicon substrate. Subsequently, open type masks (300 nm in width W3, and 30 degrees in opening spreading angle ω) as shown in FIGS. 4A, 11A, and 12A were disposed on the photoresist films, respectively. As a projection length TL1 of these masks, 50 nm, 30 nm, and 0 nm were set to the present invention, the first comparative example, and the second comparative example, respectively, as shown in Table 1. Then, the respective photoresist films were exposed by an exposure system (a KrF exima laser stepper, having an exposure energy of 30 mJ/cm$^2$, and a focus of 0 µm). Thereafter, a developing solution (an aqueous solution of 2.38% tetramethyl ammonium) was used to develop the photoresist films, thereby forming preparatory photoresist patterns (290 nm in width W4) as shown in FIGS. 5A, 11B, and 12B, respectively. Finally, a hot plate was used to heat these preparatory photoresist patterns (at a heating temperature of 180° C., and a heating time of 15 minutes), thereby forming photoresist patterns (310 nm in width W2) as shown in FIGS. 6A, 11C, and 12C, respectively.

TABLE 1

|  | Projection length TL1 (nm) | Projection length TL2 (nm) | Rounding range D (nm) |
| --- | --- | --- | --- |
| The Present Invention | 50 | 20 | 30 |
| First Comparative Example | 30 | 0 | 100 |
| Second Comparative Example | 0 | 0 | 180 |

As can be seen from the results in Table 1, the projection lengths TL2 of the preparatory photoresist patterns of the present invention, the first comparative example, and the second comparative example were 20 nm, 0 nm, and 0 nm, respectively. That is, the projected part was provided only in the preparatory photoresist pattern of the present invention. As the result, the rounding ranges D of the photoresist patterns of the present invention, the first comparative example, and the second comparative example were 30 nm, 100 nm, and 180 nm, respectively. That is, the present invention had a remarkably small rounding range. From this, it could be confirmed that the present invention is capable of controlling sufficiently the three dimensional configuration of the photoresist pattern by the presence of the projected part in the preparatory photoresist pattern.

Next, the method of forming a photoresist pattern as described in the third preferred embodiment was used to form photoresist patterns. The results were presented in Table 2. Table 2 indicates the dimensions of respective parts in the steps of forming the photoresist patterns, such as the notch depth HL1 (nm) of the mask, the notch depth HL2 (nm) of the preparatory photoresist pattern, and the rounding range D (nm) of the photoresist pattern. In Table 2, the dimensions of the respective parts in the first and second comparative examples shown in FIGS. 19A to 20C are also presented in order to compare and evaluate the dimensions of the respective parts of the present invention.

The procedure of forming the photoresist patterns was the same as in the case of forming the photoresist pattern in the first preferred embodiment, except for using the masks (5 µm in width W11) as shown in FIGS. 17A, 19A, and 20A, respectively. As a notch depth HL1 of these masks, 70 nm, 30 nm, and 0 nm were set to the present invention, the first comparative example, and the second comparative example, respectively, as indicated in Table 2.

TABLE 2

|  | Notch depth HL1 (nm) | Notch depth HL2 (nm) | Rounding Range D (nm) |
| --- | --- | --- | --- |
| The Present Invention | 70 | 30 | 50 |
| First Comparative Example | 30 | 0 | 120 |
| Second Comparative Example | 0 | 0 | 200 |

As can be seen from the results in Table 2, the notch depths HL2 of the preparatory photoresist patterns of the present invention, the first comparative example, and the second comparative example were 30 nm, 0 nm, and 0 nm, respectively. That is, the notch part was provided only in the preparatory photoresist pattern of the present invention. As the result, the rounding ranges D of the photoresist patterns of the present invention, the first comparative example, and the second comparative example were 50 nm, 120 nm, and 200 nm, respectively. That is, the present invention had a remarkably small rounding range. From this, it could be confirmed that the present invention is capable of controlling sufficiently the three dimensional configuration of the photoresist pattern by the presence of the notch part in the preparatory photoresist pattern.

While the present invention has been described above by taking several preferred embodiments and examples, the present invention is not limited to the foregoing embodiments and examples, and modifications may be made in the present invention. Specifically, for example, though the first preferred embodiment has illustrated the perpendicular magnetic recording head as a device to which the method of forming a photoresist pattern of the present invention is applicable, examples of devices other than the perpendicular magnetic recording head are thin film inductors, thin film sensors, thin film actuators, semiconductor devices, and devices equipped with these. The applications to these also enable the same effect to be obtained.

The method of forming a photoresist pattern according to the present invention is applicable to a method of manufacturing various devices such as perpendicular magnetic recording heads.

It should be understood by those skilled in the art that various modifications, combinations, sub-combinations and alterations may occur depending on design requirements and other factors insofar as they are within the scope of the appended claims or the equivalents thereof.

What is claimed is:

1. A method of forming a photoresist pattern having a convex corner part, the method comprising:
   a first step of forming a photoresist film;
   a second step of selectively exposing and developing the photoresist film so that a projected part can be formed at a position corresponding to the corner part; and
   a third step of heating the photoresist film until the projected part vanishes, wherein
   heating is at a temperature that causes thermal flow of the photoresist film.

2. A method of forming a photoresist pattern having a concave corner part, the method comprising:
   a first step of forming a photoresist film;
   a second step of selectively exposing and developing the photoresist film so that a notch part can be formed at a position corresponding to the corner part; and
   a third step of heating the photoresist film until the notch part vanishes, wherein heating is at a temperature that causes thermal flow of the photoresist film.

3. A method of manufacturing a perpendicular magnetic recording head provided with a magnetic pole layer, the magnetic pole layer expanding from a uniform width defining a recording track width to a width larger than the uniform width, the method comprising:

a first step of forming a photoresist film;

a second step of selectively exposing and developing the photoresist film so that a projected part can be formed at a position where the magnetic pole layer starts to increase in width from the uniform width;

a third step of heating the photoresist film until the projected part vanishes; and a fourth step of forming the magnetic pole layer in a region other than the photoresist film with no projected part, wherein heating is at a temperature that causes thermal flow of the photoresist film.

* * * * *